(12) United States Patent
Kang et al.

(10) Patent No.: US 11,901,348 B2
(45) Date of Patent: Feb. 13, 2024

(54) SEMICONDUCTOR PACKAGE AND METHOD OF MANUFACTURING THE SEMICONDUCTOR PACKAGE

(71) Applicant: Samsung Electronics Co., Ltd., Suwon-si (KR)

(72) Inventors: Tae-Ho Kang, Seoul (KR); Bo-Seong Kim, Seongnam-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 343 days.

(21) Appl. No.: 17/376,865

(22) Filed: Jul. 15, 2021

(65) Prior Publication Data
US 2021/0343691 A1 Nov. 4, 2021

Related U.S. Application Data

(63) Continuation of application No. 16/709,001, filed on Dec. 10, 2019, now abandoned, which is a
(Continued)

(30) Foreign Application Priority Data

Nov. 2, 2016 (KR) .................. 10-2016-0145316

(51) Int. Cl.
*H01L 25/18* (2023.01)
*H01L 25/00* (2006.01)
(Continued)

(52) U.S. Cl.
CPC .......... *H01L 25/18* (2013.01); *H01L 21/4857* (2013.01); *H01L 23/16* (2013.01); *H01L 23/49822* (2013.01); *H01L 24/16* (2013.01);

*H01L 24/19* (2013.01); *H01L 24/20* (2013.01); *H01L 24/24* (2013.01); *H01L 24/25* (2013.01); *H01L 24/48* (2013.01); *H01L 24/73* (2013.01); *H01L 24/96* (2013.01); *H01L 25/065* (2013.01);
(Continued)

(58) Field of Classification Search
None
See application file for complete search history.

(56) References Cited

U.S. PATENT DOCUMENTS 6,621,155 B1 * 9/2003 Perino ................ H01L 25/0657
257/691
6,740,964 B2 5/2004 Sasaki
(Continued)

FOREIGN PATENT DOCUMENTS

CN 103178054 A 6/2013

OTHER PUBLICATIONS

Chinese Office Action dated Sep. 15, 2022 issued in Chinese Patent Application No. 201711062541.7.

*Primary Examiner* — Nishath Yasmeen
(74) *Attorney, Agent, or Firm* — Harness, Dickey & Pierce, P.L.C.

(57) ABSTRACT

A semiconductor package includes a mold substrate, at least one first semiconductor chip in the mold substrate and including chip pads, wiring bonding pads formed at a first surface of the mold substrate and connected to the chip pads by bonding wires, and a redistribution wiring layer covering the first surface of the mold substrate and including redistribution wirings connected to the wiring bonding wirings.

20 Claims, 37 Drawing Sheets

Related U.S. Application Data continuation of application No. 15/791,831, filed on Oct. 24, 2017, now abandoned.

(51) Int. Cl.

| | | |
|---|---|---|
| *H01L 23/00* | (2006.01) | |
| *H01L 23/16* | (2006.01) | |
| *H01L 25/065* | (2023.01) | |
| *H01L 21/48* | (2006.01) | |
| *H01L 23/498* | (2006.01) | |
| *H01L 21/56* | (2006.01) | |
| *H01L 23/31* | (2006.01) | |
| *H01L 23/24* | (2006.01) | |

(52) U.S. Cl.
CPC ............ *H01L 25/50* (2013.01); *H01L 21/568* (2013.01); *H01L 23/24* (2013.01); *H01L 23/3121* (2013.01); *H01L 23/49816* (2013.01); *H01L 24/32* (2013.01); *H01L 24/83* (2013.01); *H01L 2224/04105* (2013.01); *H01L 2224/05554* (2013.01); *H01L 2224/12105* (2013.01); *H01L 2224/16227* (2013.01); *H01L 2224/2402* (2013.01); *H01L 2224/24101* (2013.01); *H01L 2224/24137* (2013.01); *H01L 2224/25171* (2013.01); *H01L 2224/32145* (2013.01); *H01L 2224/48091* (2013.01); *H01L 2224/48145* (2013.01); *H01L 2224/48147* (2013.01); *H01L 2224/48227* (2013.01); *H01L 2224/49175* (2013.01); *H01L 2224/73215* (2013.01); *H01L 2224/73265* (2013.01); *H01L 2224/73267* (2013.01); *H01L 2224/73277* (2013.01); *H01L 2224/83191* (2013.01); *H01L 2225/0651* (2013.01); *H01L 2225/06506* (2013.01); *H01L 2225/06562* (2013.01); *H01L 2924/00014* (2013.01); *H01L 2924/1431* (2013.01); *H01L 2924/1434* (2013.01); *H01L 2924/15311* (2013.01); *H01L 2924/181* (2013.01); *H01L 2924/18165* (2013.01); *H01L 2924/19041* (2013.01); *H01L 2924/19042* (2013.01); *H01L 2924/19043* (2013.01); *H01L 2924/19103* (2013.01); *H01L 2924/19105* (2013.01)

(56) References Cited

U.S. PATENT DOCUMENTS

| | | |
|---|---|---|
| 6,781,221 B2 | 8/2004 | Yoneda |
| 7,902,660 B1 | 3/2011 | Lee et al. |
| 7,989,941 B2 | 8/2011 | Chin et al. |
| 8,987,053 B2 | 3/2015 | Upadhyayula et al. |
| 9,412,720 B2 | 8/2016 | Nam et al. |
| 9,496,216 B2 | 11/2016 | Chun et al. |
| 9,673,183 B2* | 6/2017 | Lim ..................... H01L 21/565 |
| 9,741,644 B2* | 8/2017 | Katti ................... H01L 23/4952 |
| 2004/0142506 A1* | 7/2004 | Corisis ................ H01L 25/0657 |
| | | 438/106 |
| 2007/0218588 A1 | 9/2007 | Takiar et al. |
| 2008/0029884 A1* | 2/2008 | Grafe .................. H01L 25/0652 |
| | | 257/E25.023 |
| 2008/0128888 A1 | 6/2008 | Park et al. |
| 2008/0284017 A1* | 11/2008 | Lee ......................... H05K 1/112 |
| | | 257/738 |
| 2010/0109143 A1* | 5/2010 | Cho ........................ H01L 24/13 |
| | | 257/723 |
| 2011/0241192 A1 | 10/2011 | Ding et al. |
| 2013/0049228 A1* | 2/2013 | Nam ................... H01L 25/0657 |
| | | 257/777 |
| 2013/0056882 A1 | 3/2013 | Kim et al. |
| 2015/0021761 A1 | 1/2015 | Park |
| 2015/0251903 A1 | 9/2015 | Bowles et al. |
| 2016/0086921 A1 | 3/2016 | Cho |
| 2016/0293575 A1 | 10/2016 | Liu et al. |
| 2016/0351494 A1 | 12/2016 | Chen et al. |

\* cited by examiner

SEMICONDUCTOR PACKAGE AND METHOD OF MANUFACTURING THE SEMICONDUCTOR PACKAGE

PRIORITY STATEMENT

This application is a continuation of U.S. application Ser. No. 16/709,001, filed on Dec. 10, 2019, which is a continuation of U.S. application Ser. No. 15/791,831, filed on Oct. 24, 2017, which claims priority under 35 U.S.C. § 119 to Korean Patent Application No. 10-2016-0145316, filed on Nov. 2, 2016 in the Korean Intellectual Property Office (KIPO), the contents of each of which are herein incorporated by reference in their entirety.

BACKGROUND

1. Field

Example embodiments relate to semiconductor packages and/or methods of manufacturing the semiconductor package. More particularly, example embodiments relate to fan out wafer level packages (FOWLP) and/or methods of manufacturing the semiconductor packages.

2. Description of the Related Art

A fan out type wafer level package may include a mold layer surrounding sidewalls and a bottom surface of a semiconductor chip and a redistribution wiring layer formed on the semiconductor chip. In case that the semiconductor chip is mounted in a flip chip manner, a redistribution wiring process in wafer level may be performed on a flip chip bump exposed from the mold layer to form the redistribution wiring layer. However, when the semiconductor chip has a bonding wiring structure, it may be difficult to perform the redistribution wiring process in wafer level.

SUMMARY

Some example embodiments provide fan out wafer level packages including a bonding wiring structure.

Some example embodiments provide methods of manufacturing a fan out wafer level package.

According to an example embodiment, a semiconductor package includes a mold substrate, at least one first semiconductor chip in the mold substrate, the at least one first semiconductor chip including chip pads, wiring bonding pads at a first surface of the mold substrate, the wiring bonding pads connected to the chip pads by bonding wires, and a redistribution wiring layer covering the first surface of the mold substrate, the distribution wiring layer including redistribution wirings, the redistribution wirings connected to the wiring bonding pads.

According to an example embodiment, a method of manufacturing includes forming wiring bonding pads on a dummy substrate, stacking at least one first semiconductor chip on the dummy substrate, forming bonding wires to connect first chip pads of the first semiconductor chip and the wiring bonding pads to each other, cover the first semiconductor chip on the dummy substrate with a molding member to form a mold substrate, removing the dummy substrate from the mold substrate such that the wiring bonding pads are exposed from a first surface of the mold substrate, and forming a redistribution wiring layer on the first surface of the mold substrate, the redistribution wiring layer including redistribution wirings electrically connected to the wiring bonding pads.

According to an example embodiment, a method of manufacturing a semiconductor package includes forming relay bonding pads on a dummy substrate, stacking at least one first semiconductor chip on the dummy substrate, forming conductive connection members to connect chip pads of the first semiconductor chip with the relay bonding pads, covering the first semiconductor chip on the dummy substrate with a molding member to form a mold substrate on the dummy substrate, removing the dummy substrate from the mold substrate such that the relay bonding pads are exposed from a first surface of the mold substrate, and forming a redistribution wiring layer on the first surface of the mold substrate, the redistribution wiring layer including redistribution wirings electrically connected to the relay bonding pads.

According to an example embodiment, a method of manufacturing a semiconductor package includes forming relay bonding pads on a dummy substrate, stacking at least one first semiconductor chip on the dummy substrate, forming conductive connection members to connect chip pads of the first semiconductor chip with the relay bonding pads, covering the first semiconductor chip on the dummy substrate with a molding member to form a mold substrate on the dummy substrate, removing the dummy substrate from the mold substrate such that the relay bonding pads are exposed from a first surface of the mold substrate, and forming a redistribution wiring layer on the first surface of the mold substrate, the redistribution wiring layer including redistribution wirings electrically connected to the relay bonding pads.

According to an example embodiment, a semiconductor package includes a first semiconductor chip having a bonding wiring structure in a mold substrate, wiring bonding pads formed in a first surface of the mold substrate and bonded to end portions of bonding wires electrically connected to the first semiconductor chip, and a fan out type redistribution wiring layer formed on the first surface of the mold substrate by a redistribution wiring process. A first redistribution wiring of the redistribution wiring layer may be bonded to the wiring bonding pad exposed from the first surface of the mold substrate.

According to an example embodiment, a semiconductor package includes a redistribution wiring layer including redistribution wirings and fan out type landing pads connected to the redistribution wirings, at least one first semiconductor chip on the redistribution wiring layer, the at least one first semiconductor chip including a first surface having first chip pads thereon and a second surface facing the redistribution wiring layer, wiring bonding pads at a first surface of the redistribution wiring layer, the wire bonding pads connected to corresponding ones of the redistribution wirings, and bonding wires connecting the first chip pads with wiring bonding pads such that the first chip pads are connected to corresponding ones of the fan out type landing pads on a second surface of the redistribution wiring layer, the second surface of the redistribution wiring layer being opposite to the first surface of the redistribution wiring layer.

Accordingly, the wiring bonding pads may serve as a medium to electrically connect the bonding wires to the redistribution wirings, which are formed by the redistribution wiring process, and provide physical bonding surfaces therebetween. The wiring bonding pads may mount the semiconductor chips, which are incompatible with the fan out type redistribution wiring layer due to the bonding wiring structure, on the redistribution wiring layer, thereby providing the fan out wafer level package.

BRIEF DESCRIPTION OF THE DRAWINGS

Example embodiments will be more clearly understood from the following detailed description taken in conjunction with the accompanying drawings.

FIG. 1 is a cross-sectional view illustrating a semiconductor package in accordance with an example embodiment.

FIGS. 2 to 14 are views illustrating a method of manufacturing a semiconductor package in accordance with an example embodiment.

FIGS. 15 to 19 are cross-sectional views illustrating a method of manufacturing a semiconductor package in accordance with an example embodiment.

FIG. 20 is a cross-sectional view illustrating a semiconductor package in accordance with an example embodiment.

FIGS. 21 to 27 are views illustrating a method of manufacturing a semiconductor package in accordance with an example embodiment.

FIG. 28 is a cross-sectional view illustrating a semiconductor package in accordance with an example embodiment.

FIGS. 29 to 37 are views illustrating a method of manufacturing a semiconductor package in accordance with an example embodiment.

DETAILED DESCRIPTION

Figure 1:
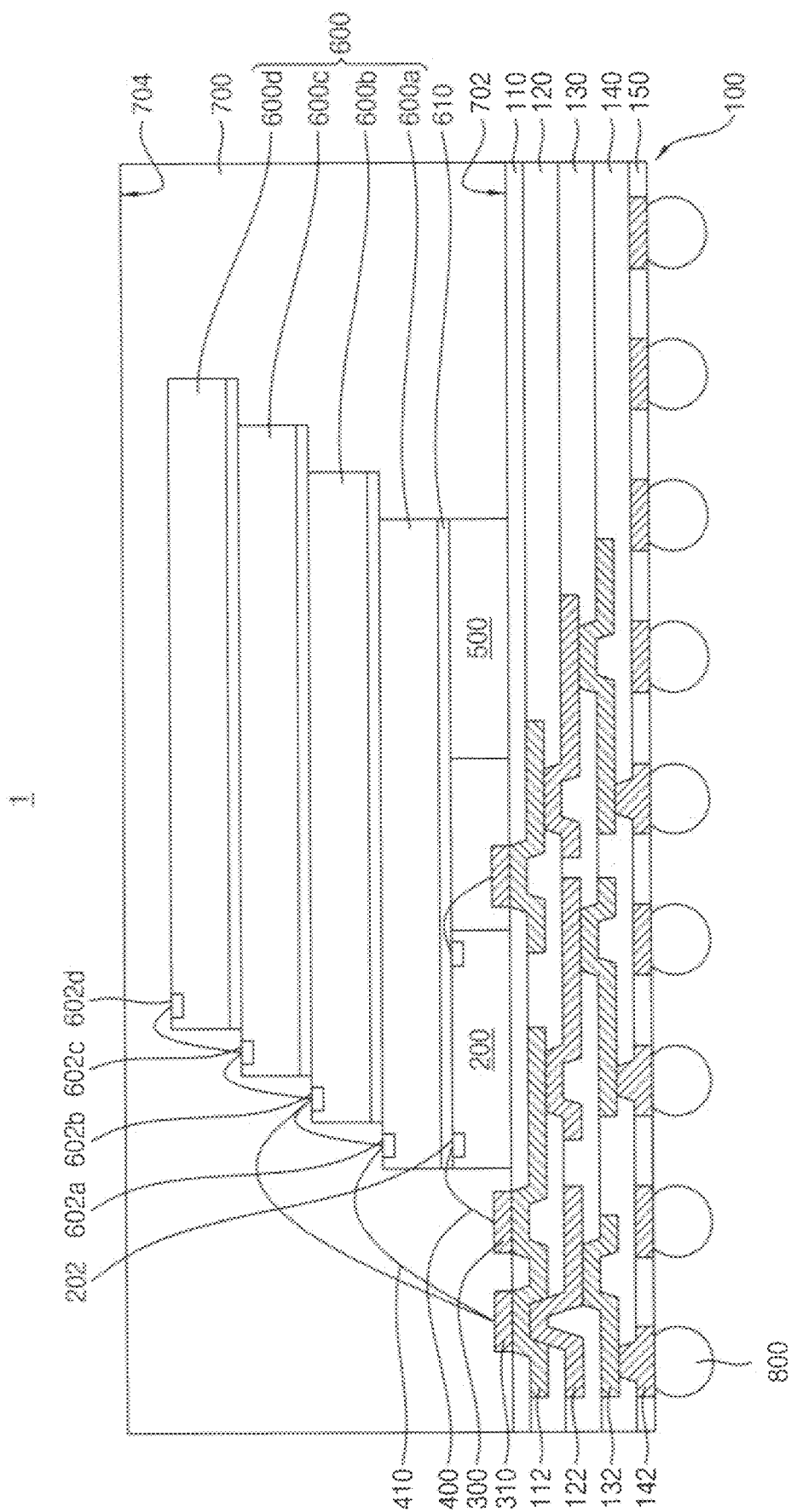
FIGS. 1 to 37 represent non-limiting, example embodiments as described herein.

FIG. 1 is a cross-sectional view illustrating a semiconductor package in accordance with an example embodiment.

Referring to FIG. 1, a semiconductor package 1 may include a mold substrate 700, a first semiconductor chip 200 disposed in the mold substrate 700, wiring bonding pads 300 formed in a first surface 702 of the mold substrate 700, and a redistribution wiring layer 100 covering the first surface 702 of the mold substrate 700 and including redistribution wirings connected to the wiring bonding pads 300. The semiconductor package 1 may further include second semiconductor chips 600 (e.g., 600a, 600b, 600c, and 600d) disposed in the mold substrate 700 and wiring bonding pads 310 formed in the first surface of the mold substrate 700. The semiconductor package 1 may further include a support member 500 disposed in the mold substrate 700. The semiconductor package 1 may further include outer connection members 800 disposed on the redistribution wiring layer 100.

In example embodiments, the semiconductor package 1 may be a fan out wafer level package including the mold substrate 700 and the redistribution wiring layer 100 formed on the first surface 702 of the mold substrate 700. The redistribution wiring layer 100 may be formed on the first surface 702 of the mold substrate 700 by a redistribution wiring process in wafer level. The first semiconductor chip 200 and the second semiconductor chip 600 electrically connected to the bonding wires 400 and 410, respectively, may be received in the mold substrate 700.

The wiring bonding pads 300 and 310 connected to end portions of the bonding wires 400 and 410, respectively, may be formed in the first surface 702 of the mold substrate 700. The wiring bonding pads 300 and 310 may be exposed from the first surface 702 of the mold substrate 700, and may be connected to the redistribution wirings of the redistribution wiring layer 100. For example, first surfaces of the wiring bonding pads 300 and 310 may be connected to the end portion of the bonding wires, respectively, and second surfaces of the wiring bonding pads 300 and 310 opposite to the first surfaces may be exposed from the first surface 702 of the mold surface 700 and may be connected to the redistribution wiring. The second surface of the wiring bonding pads 300 and 310 may be coplanar with the first surface 702 of the mold substrate 700. The first surface and side surfaces of the wiring bonding pads 300 and 310 may be covered by the mold substrate 700.

Accordingly, the first surface of the wiring bonding pad may be connected to the bonding wire, and the second surface of the wiring bonding pad may be connected to the redistribution wiring. That is, the wiring bonding pad may be a relay bonding pad as a medium structure to provide physical bonding surfaces for connecting the bonding wire and the redistribution wire. The wiring bonding pad may have the same or substantially similar structure to under bump metallurgy (UBM) and perform the same or substantially similar function.

The wiring bonding pads 300 and 310 may be provided as a conductive pattern, however, it may not limited thereto. For example, the wiring bonding pads 300 and 310 may be provided as a connector including a conductive electrode penetrating an insulation layer, a silicon-based semiconductor layer, etc.

For example, the first semiconductor chip 200 may include a plurality of chip pads 202 on its first surface (e.g., an active surface). The first semiconductor chip 200 may be received in the mold substrate 700 such that a second surface of the first semiconductor chip 200 opposite to the first surface faces the redistribution wiring layer 100. The second surface of the first semiconductor chip 200 may be exposed from the first surface 702 of the mold substrate 700.

The first semiconductor chip 200 may include integrated circuits. For example, the first semiconductor chip 200 may be a logic chip including a logic circuit. The logic chip may be a controller for controlling memory chips. Although only some chip pads are illustrated in the figure, the illustrated structure and arrangement of the chip pads are merely an example, and they are not limited thereto.

The support member 500 may function to support a plurality of the second semiconductor chips 600. The support member 500 may have a height from the redistribution wiring layer 100, which is the same as that of the first semiconductor chip 200. A surface of the support member 500 may be exposed from the first surface 702 of the mold substrate 700. For example, the support member 500 may include a semiconductor substrate, a metal or non-metal plate, a printed circuit board, etc.

The support member 500 may include a passive device therein. For example, the support member 500 may include a capacitor, a resistor, an inductor, etc. The support member 500 may provide functions such as decoupling, filtering, resonance damping and/or voltage control. Although it is not illustrated in the figure, the support member 500 may be electrically connected to some of the redistribution wirings.

A plurality of the second semiconductor chips 600 may be disposed on the first semiconductor chip 200 and the support member 500. The second semiconductor chips 600a, 600b, 600c, and 600d may include a plurality of chip pads 602a, 602b, 602c and 602d, respectively, on their respective first surfaces (e.g., active surfaces). The second semiconductor chip 600 may be received in the mold substrate 700 such that a second surface of the second semiconductor chip 600 opposite to the first surface faces the redistribution wiring layer 100.

The second semiconductor chips 600 may include memory chips. The memory chip may include various types of memory circuits, for example, DRAM, SRAM, flash PRAM, ReRAM, FeRAM or MRAM. The number, the size, the arrangement, etc., of the second semiconductor chips may be variously modified.

The wiring bonding pad 300 may be formed in the first surface 702 of the mold substrate 700 and may be connected to the end portions of the bonding wires 400. Accordingly, the wiring bonding pads 300 may be electrically connected to the chip pad 202 of the first semiconductor chip 200 by the bonding wires 400.

The redistribution wirings of the redistribution wiring layer 100 may make contact with the second surfaces of the wiring bonding pads 300, 310 exposed from the first surface 702 of the mold substrate 700.

For example, the redistribution wiring layer 100 may include a first insulation layer 110 formed on the first surface 702 of the mold substrate 700, first openings exposing the wiring bonding pads 300 and 310, and first redistribution wirings 112 formed on the first insulation layer 110. At least portions of the first redistribution wirings 112 may directly contact the wiring bonding pads 300, 310 through the first opening.

The redistribution wiring layer 100 may include a second insulation layer 120 formed on the first insulation layer 120, second openings exposing the first redistribution wirings 112, and second redistribution wirings 122 formed on the second insulation layer 120. At least a portion of the second redistribution wiring 122 may directly contact the first redistribution wiring 112 through the second opening.

The redistribution wiring layer 100 may include a third insulation layer 130 formed on the second insulation layer 120, third openings exposing the second redistribution wirings 122, and third redistribution wirings 132 formed on the third insulation layer 130. At least a portion of the third redistribution wiring 132 may directly contact the second redistribution wiring 122 through the third opening.

The redistribution wiring layer 100 may include a fourth insulation layer 140 formed on the third insulation layer 130, fourth openings exposing the third redistribution wirings 132, and fourth redistribution wirings 142 formed on the fourth insulation layer 140. At least a portion of the fourth redistribution wiring 142 may directly contact the third redistribution wiring 132 through the fourth opening.

The redistribution wiring layer 100 may include a fifth insulation layer 150 formed on the fourth insulation layer 140, fifth openings exposing the fourth redistribution wirings 142. Thus, the redistribution wiring layer 100 may include fan out type solder ball landing pads which are formed on the mold substrate 700 and correspond to each die of a wafer by performing semiconductor manufacturing processes.

Outer connection members 800 may be disposed on portions of the fourth redistribution wirings 142 exposed through the fifth openings. For example, the outer connection member 800 may include a solder ball. The portion of the fourth redistribution wirings 142 may serve as a solder ball landing pad (e.g., a package pad).

As mentioned above, the semiconductor package 1 as the fan out wafer level package may include the first semiconductor chip 200 and a plurality of second semiconductor chips 600 having bonding wiring connections in the mold substrate 700, the wiring bonding pads 300 and 310 formed in the first surface 702 of the mold substrate 700 and bonded to the end portions of the bonding wires 400 and 410 electrically connected to the first and second semiconductor chips, respectively, and the fan out type redistribution wiring layer 100 formed on the first surface 702 of the mold substrate 700 by a redistribution wiring process. The first redistribution wiring 112 of the redistribution wiring layer 100 may be bonded to the wiring bonding pads 300, 310 exposed from the first surface 702 of the mold substrate 700.

Accordingly, the wiring bonding pads 300 and 310 may serve as a medium to electrically connect the bonding wires to redistribution wirings formed by the redistribution wiring process and provide physical bonding surfaces therebetween. The wiring bonding pads may mount the semiconductor chips, which are incompatible with or are difficult to be compatible with the fan out type redistribution wiring layer due to the bonding wiring structure, on the redistribution wiring layer, thereby providing the fan out wafer level package.

Hereinafter, a method of manufacturing the semiconductor package in FIG. 1 will be explained.

FIGS. 2 to 14 are views illustrating a method of manufacturing a semiconductor package in accordance with an example embodiment. FIGS. 2, 3, 4, 6, 9, 11, 12, 13 and 14 are cross-sectional views illustrating the method of manufacturing a semiconductor package. FIG. 5 is a plan view of FIG. 4. FIG. 7 is a plan view of FIG. 6. FIG. 10 is a plan view of FIG. 9.

Figure 2:
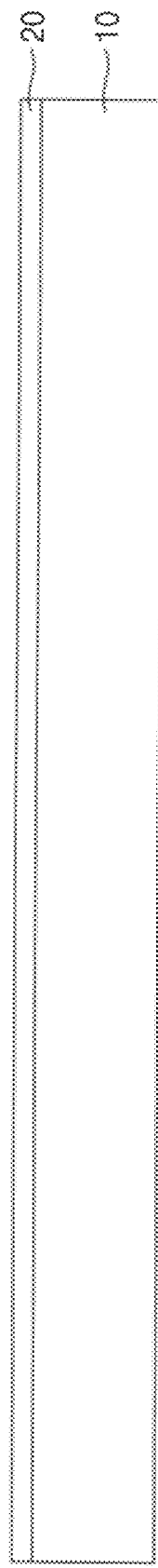

Referring to FIG. 2, first, a separating layer 20 may be formed on a dummy substrate 10.

In some example embodiments, the dummy substrate 10 may be used as a base substrate on which a plurality of semiconductor chips are stacked and then molded. The dummy substrate 10 may have a size corresponding to a wafer. For example, the dummy substrate 10 may include a silicon substrate, a glass substrate, a metal or non-metal plate, etc.

The separating layer 20 may include a polymer tape that serves as a temporary adhesive. The separating layer 20 may include a material that loses its adhesive strength, for example, when irradiated with light or heated. For example, the separating layer 20 may include a dual cure silicon adhesive that is cross-linkable by irradiation of ultraviolet ray or visible light.

Figure 3:
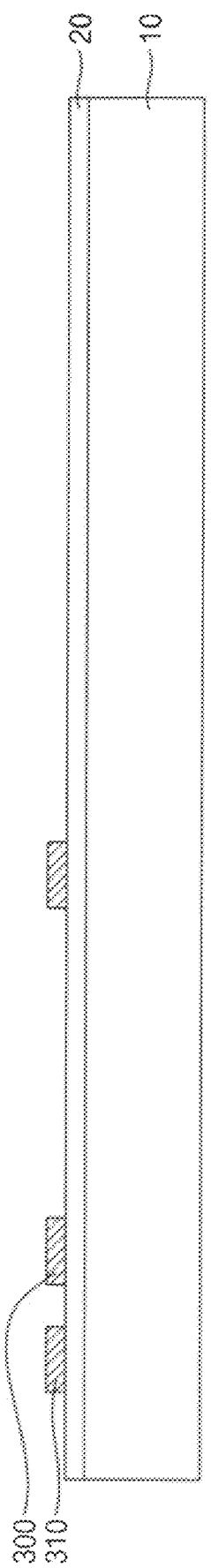

Referring to FIG. 3, a plurality of relay bonding pads 300 and 310 may be formed on the separating layer 20.

In some example embodiments, the relay bonding pads 300 and 310 may include metal patterns spaced apart from each other. The metal patterns may be formed by, for example, a sputtering process, a plating process, and a patterning process. The metal pattern may be adhered on the separating layer 20 in a desired (or alternatively, predetermined) position. For example, the relay bonding pads 300 and 310 may include a metal (e.g., gold (Au), copper (Cu), or aluminum (Al)), or a metal alloy, (e.g., nickel/gold (Ni/Au), or tin/copper (Sn/Cu)).

The relay bonding pads 300 and 310 may be used as wiring bonding pads bonded to bonding wires. The relay bonding pad 300 may be a metal bonding part to be bonded to the bonding wire for electrical connection to a first semiconductor chip which will be stacked later. The relay bonding pad 310 may be a metal bonding part to be bonded to the bonding wire for electrical connection to a second semiconductor chip will be stacked later.

Figure 4:
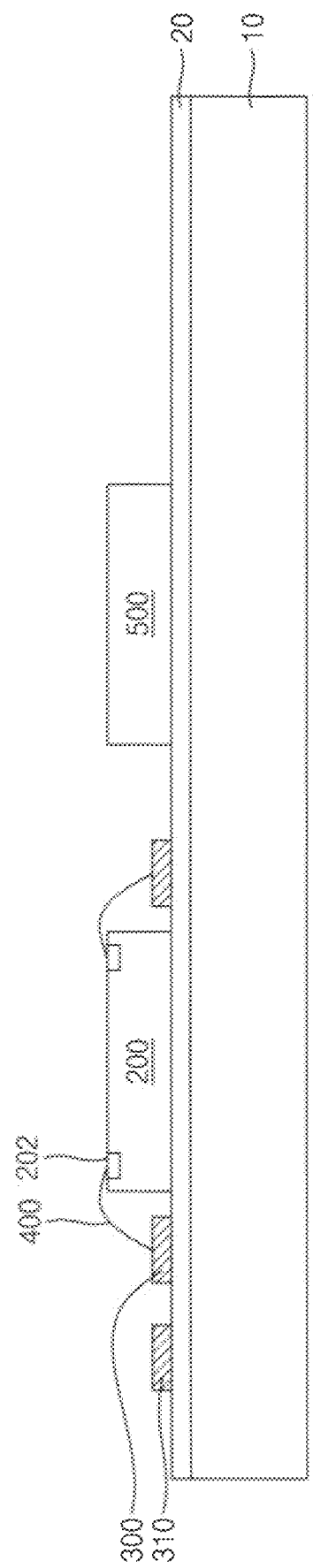
Figure 5:
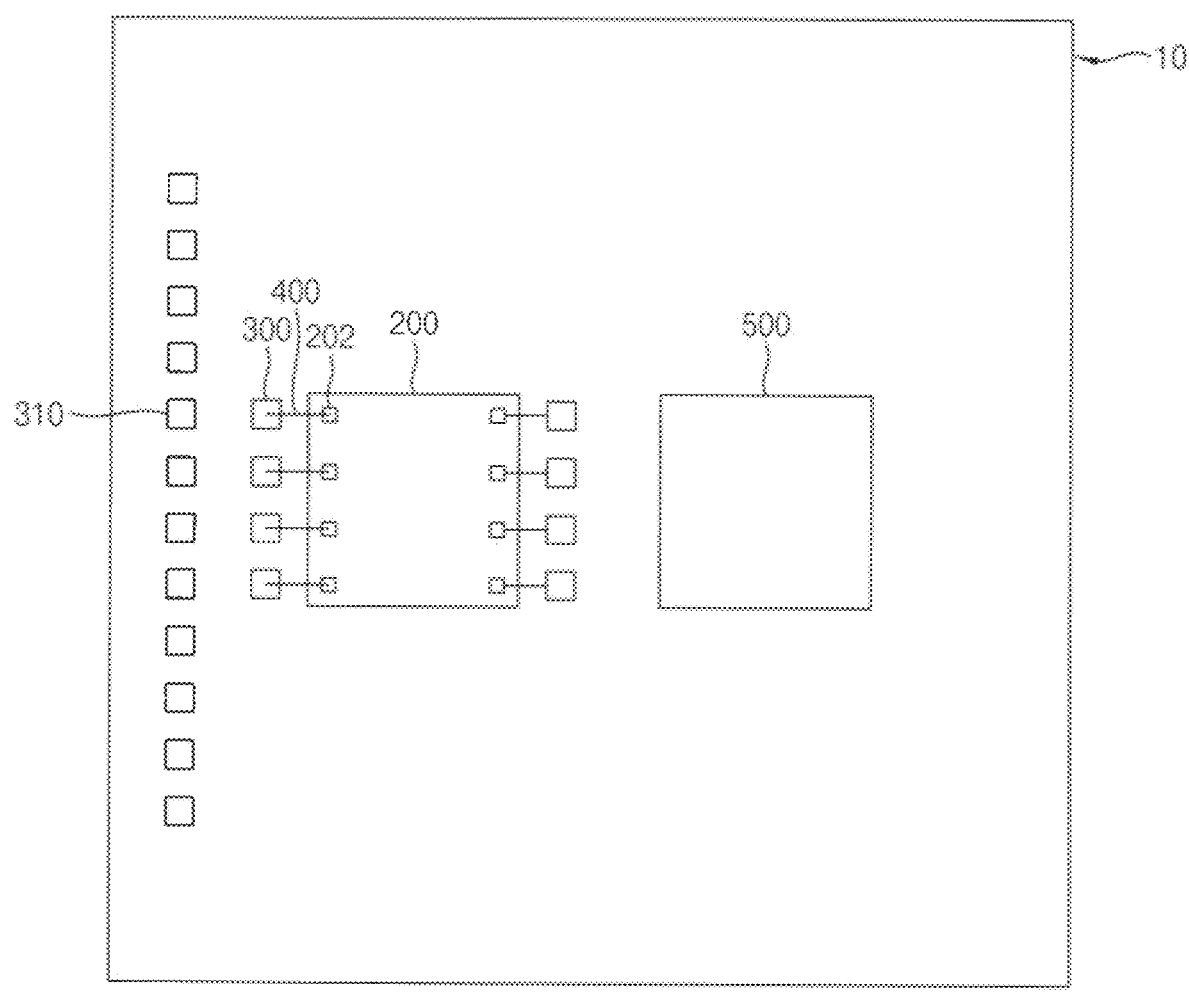

Referring to FIGS. 4 and 5, after a first semiconductor chip 200 is disposed on the separating layer 20, chip pads 202 of the first semiconductor chip 200 may be connected to the relay bonding pads 300 by conductive connection members 400. A support member 500 may be disposed adjacent to the first semiconductor chip 200 on the separating layer 20.

In some example embodiments, the first semiconductor chip 200 may include a plurality of the chip pads 202 on a first surface (e.g., an active surface). The first semiconductor chip 200 may be arranged on the dummy substrate 10 such that a second surface of the first semiconductor chip 200 opposite to the first surface faces the dummy substrate 10.

The conductive connection members 400 may be bonding wires. In such case, the relay bonding pads 300 may be wiring bonding pads. A wiring bonding process may be performed to electrically connect the chip pads 202 of the first semiconductor chip 200 and the wiring bonding pads 300 to each other with the bonding wires 400. Thus, end portions of the bonding wires 400 may be bonded to first surfaces of the wiring bonding pads 300, respectively.

The first semiconductor chip 200 may include integrated circuits. For example, the first semiconductor chip 200 may be a logic chip including a logic circuit. The logic chip may be a controller for controlling memory chips. The structure and arrangement of the chip pads illustrated in the figure are merely an example, and they are not limited thereto.

The support member 500 may support a plurality of semiconductor chips stacked thereon, as described later. The support member 500 may have a height from the separating layer 20 the same as that of the first semiconductor chip 200. Accordingly, an upper surface of the support member 500 may be coplanar with the first surface of the first semiconductor chip 200. For example, the support member 500 may include a semiconductor substrate, a metal or non-metal plate, a printed circuit board, etc.

The support member 500 may include a passive device therein. For example, the support member 500 may include a capacitor, a resistor, an inductor, etc. The support member 500 may provide functions such as decoupling, filtering, resonance damping and/or voltage control. Although it is not illustrated in the figures, the support member 500 may be electrically connected to some of redistribution wirings.

Figure 6:
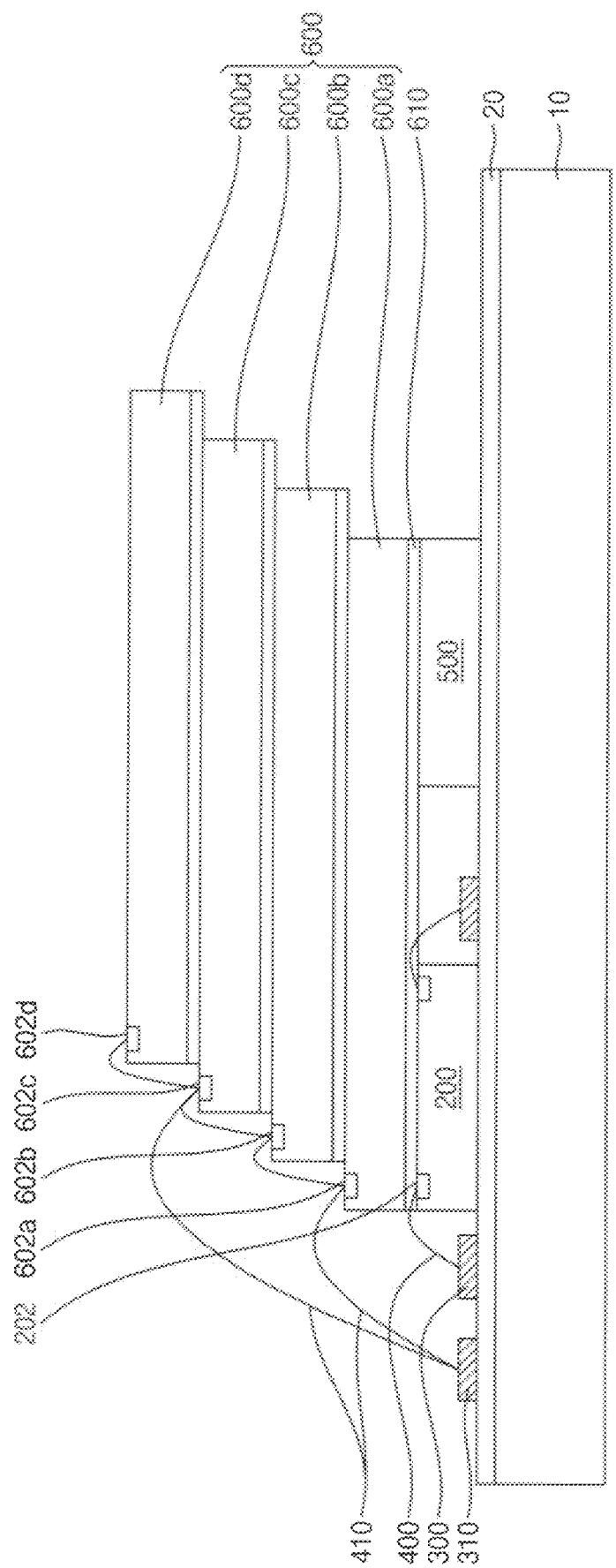
Figure 7:
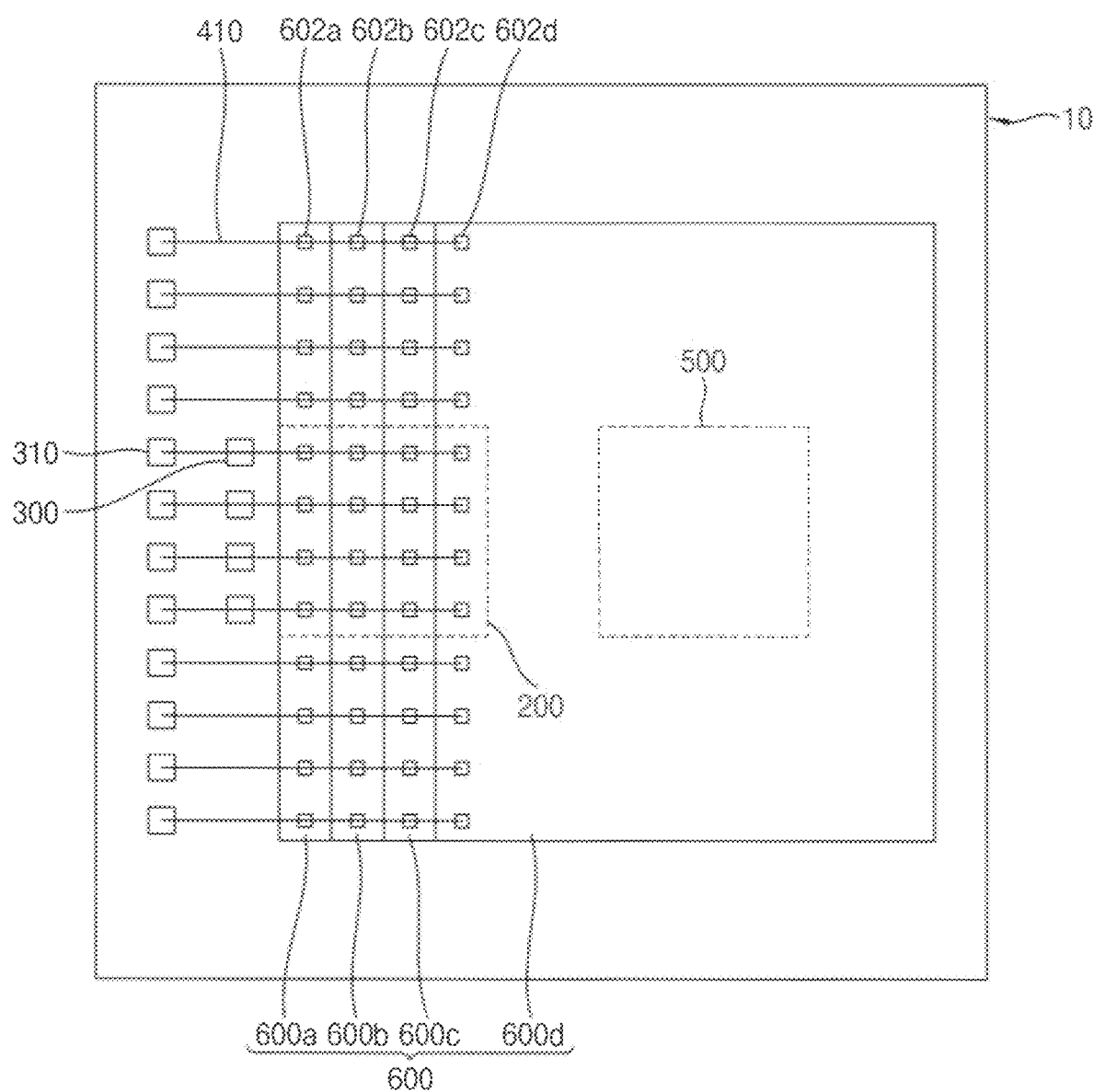

Referring to FIGS. 6 and 7, after a plurality of second semiconductor chips 600 are stacked on the first semiconductor chip 200, the support member 500, chip pads 602a, 602b, 602c, and 602d of the respective second semiconductor chips 600a, 600b, 600c, and 600d may be electrically connected to the relay bonding pads 310 by conductive connection members 410.

In some example embodiments, the second semiconductor chips 600a, 600b, 600c and 600d may include a plurality of the chip pads 602a, 602b, 602c and 602d on their respective first surfaces (e.g., active surfaces). The second semiconductor chips 600 may be arranged on the dummy substrate 10 such that a second surface of the second semiconductor chip 600 opposite to the first surface faces the dummy substrate 10.

A plurality of second semiconductor chips 600a, 600b, 600c and 600d may be stacked sequentially by adhesive layers 610. The second semiconductor chips 600a, 600b, 600c and 600d may be staked in a cascade structure. The second semiconductor chips may be offset to each other. An area of the second semiconductor chip is greater than an area of the first semiconductor chip or the support member when viewed in a plan view.

The conductive connection members 410 may be bonding wires. In such case, the relay bonding pads 310 may be wiring bonding pads. A wiring bonding process may be performed to electrically connect the chip pads 602a, 602b, 602c and 602d of the second semiconductor chips 600 and the wiring bonding pads 310 to each other with the bonding wires 410. Thus, end portions of the bonding wires 410 may be bonded to first surfaces of the wiring bonding pads 310.

The second semiconductor chips 600 may include memory chips. The memory chip may include various types of memory circuits, for example, DRAM, SRAM, flash PRAM, ReRAM, FeRAM or MRAM. The number, the size, the arrangement, etc., of the second semiconductor chips may be variously changed.

Figure 8:
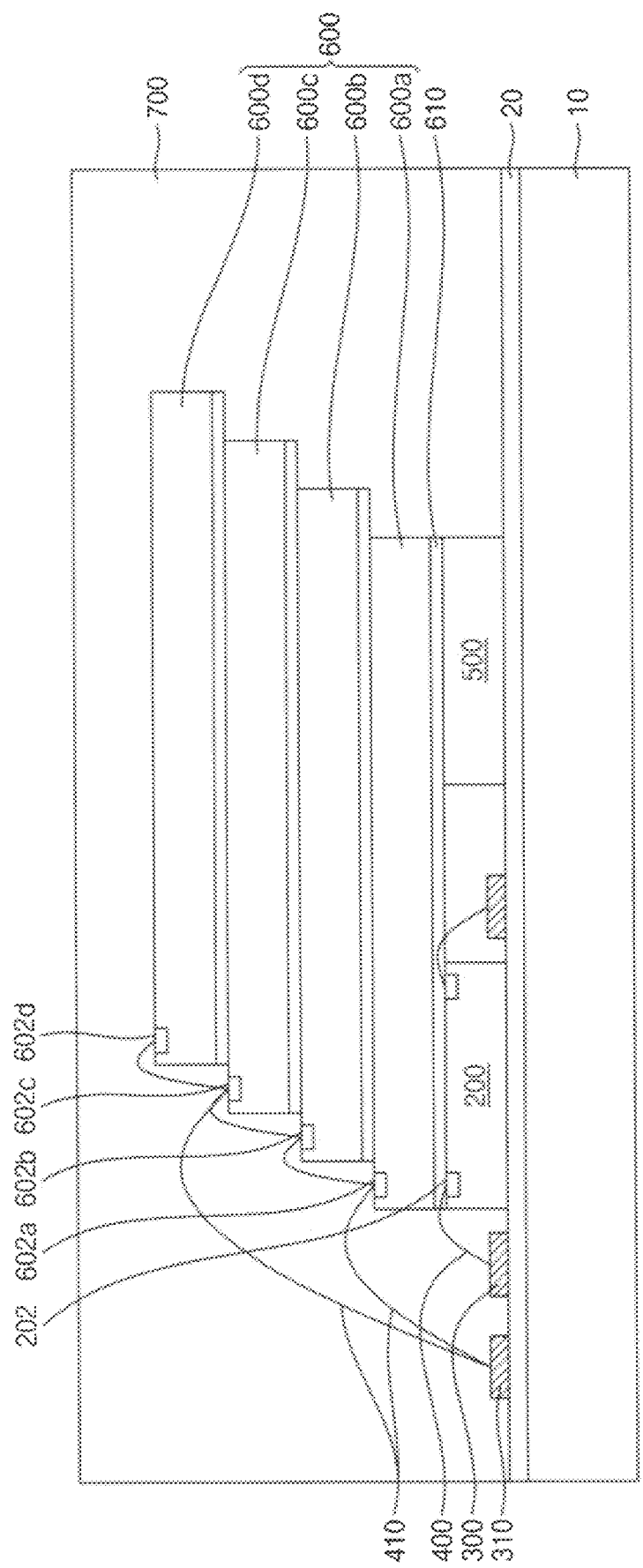

Referring to FIG. 8, a mold substrate 700 may be formed on the dummy substrate 10 to cover the first semiconductor chip 200 and the second semiconductor chips 600.

In some example embodiments, a molding member may be formed on the separating layer 20 by a molding process, to form the mold substrate 700 to cover the first semiconductor chip 200, the support member 500 and the second semiconductor chips 600. For example, the mold substrate 700 may include an epoxy molding compound.

Figure 9:
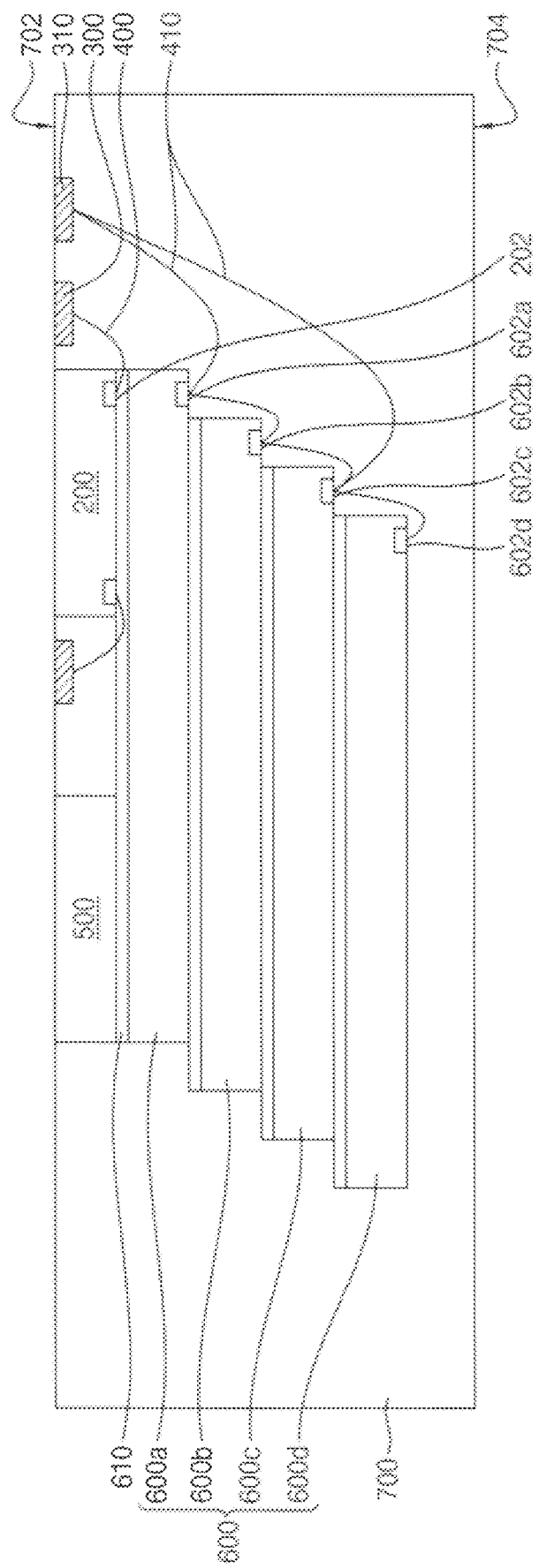
Figure 10:
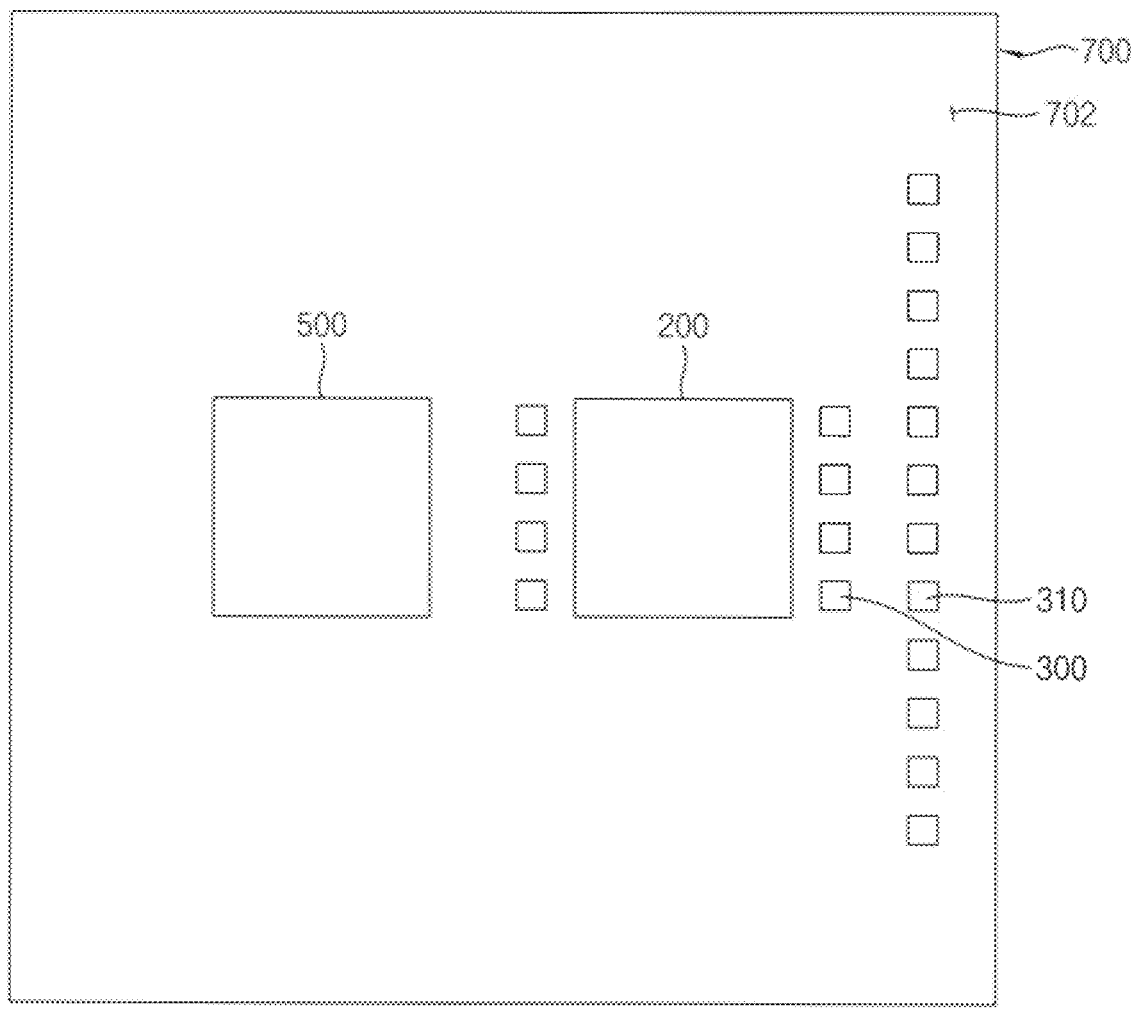

Referring to FIGS. 9 and 10, the structure including the mold substrate 700 formed therein in FIG. 8 may be reversed, and then, the dummy substrate 10 and the separating layer 20 may be removed from the mold substrate 700.

In some example embodiments, the separating layer 20 may be irradiated with light or may be heated to remove the dummy substrate 10 from the mold substrate 700. As the dummy substrate 10 is removed, the relay bonding pads 300 and 310 may be exposed from a first surface 702 of the mold substrate 700. In addition, the second surface of the first semiconductor chip and a bottom surface of the support substrate 500 may be exposed from the first surface 702 of the mold substrate 700.

Accordingly, the wiring bonding pads 300 and 310 may be formed in the first surface 702 of the mold substrate 700. The wiring bonding pads 300 may be connected to end portions of the bonding wires 400 which are connected to the chip pad 202 of the first semiconductor chip 200. The wiring bonding pad 310 may be connected to end portions of the bonding wire 410 which are connected to the chip pad of the second semiconductor chip 600. Second surfaces of the wiring bonding pads 300, 310 opposite to the first surfaces of the wiring bonding pads 300 and 310 to which the end portions of the bonding wires 400 and 410 are bonded, respectively, may be exposed from the first surface 702 of the mold substrate 700.

Figure 11:
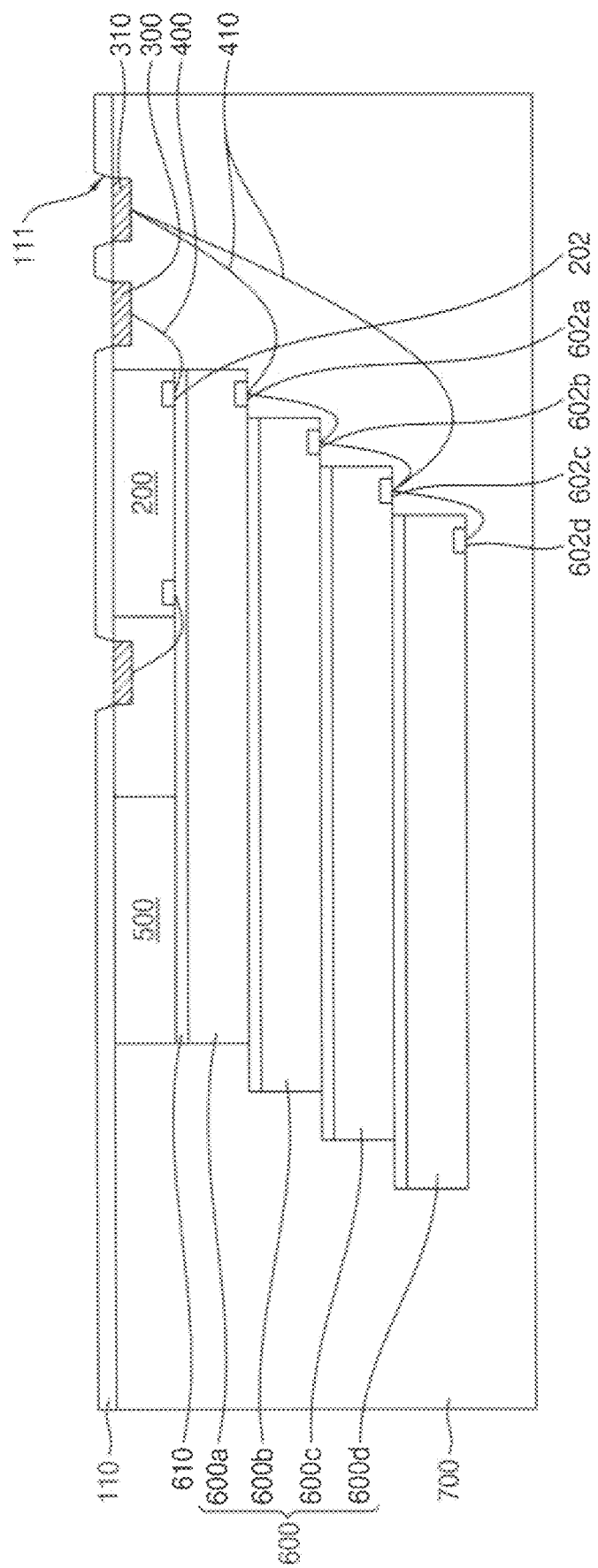

Referring to FIG. 11, a first insulation layer 110 having first openings 111 exposing the wiring bonding pads 300 and 310 may be formed on the first surface 702 of the mold substrate 700.

In some example embodiments, after the first insulation layer 110 is formed to cover the first surface 702 of the mold substrate 700, the first insulation layer 110 may be patterned to define first openings 111 that expose the wiring bonding pads 300, 310 respectively.

For example, the first insulation layer 110 may include polymer, a dielectric material, etc. The first insulation layer 110 may be formed by a vapor deposition process, a spin coating process, etc.

Figure 12:
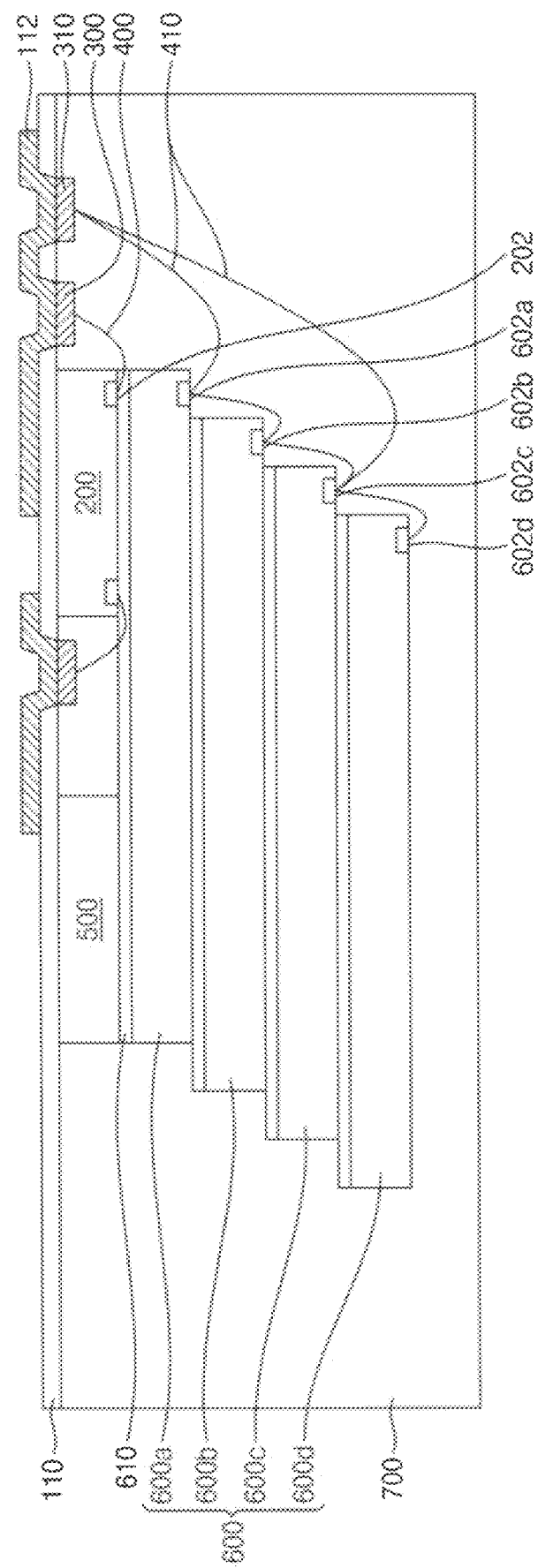

Referring to FIG. 12, first redistribution wirings 112 may be formed on the first insulation layer 110 to make contact with the wiring bonding pads 300 and 310 through the first openings 111.

In some example embodiments, the first redistribution wirings 112 may be formed on the first insulation layer 110 and on the respective wiring bonding pads 300 and 310, respectively. For example, the first redistribution wirings 112 may be formed by forming a seed layer on at least a portion of the first insulation layer 110 and on the first openings 111, pattering the seed layer, and performing an electroplating process.

Accordingly, the first redistribution wirings 112 may make contact with the wiring bonding pads 300 and 310 through the first openings 111, respectively.

Figure 13:
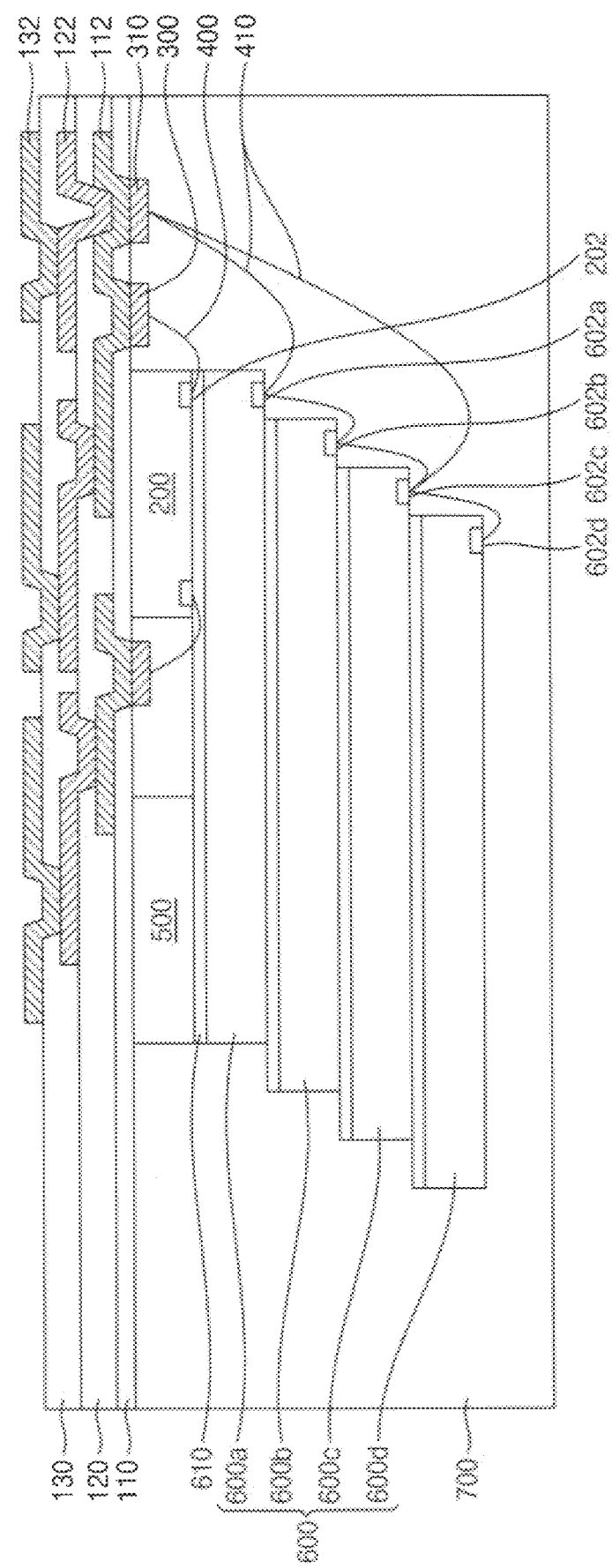
Figure 14:
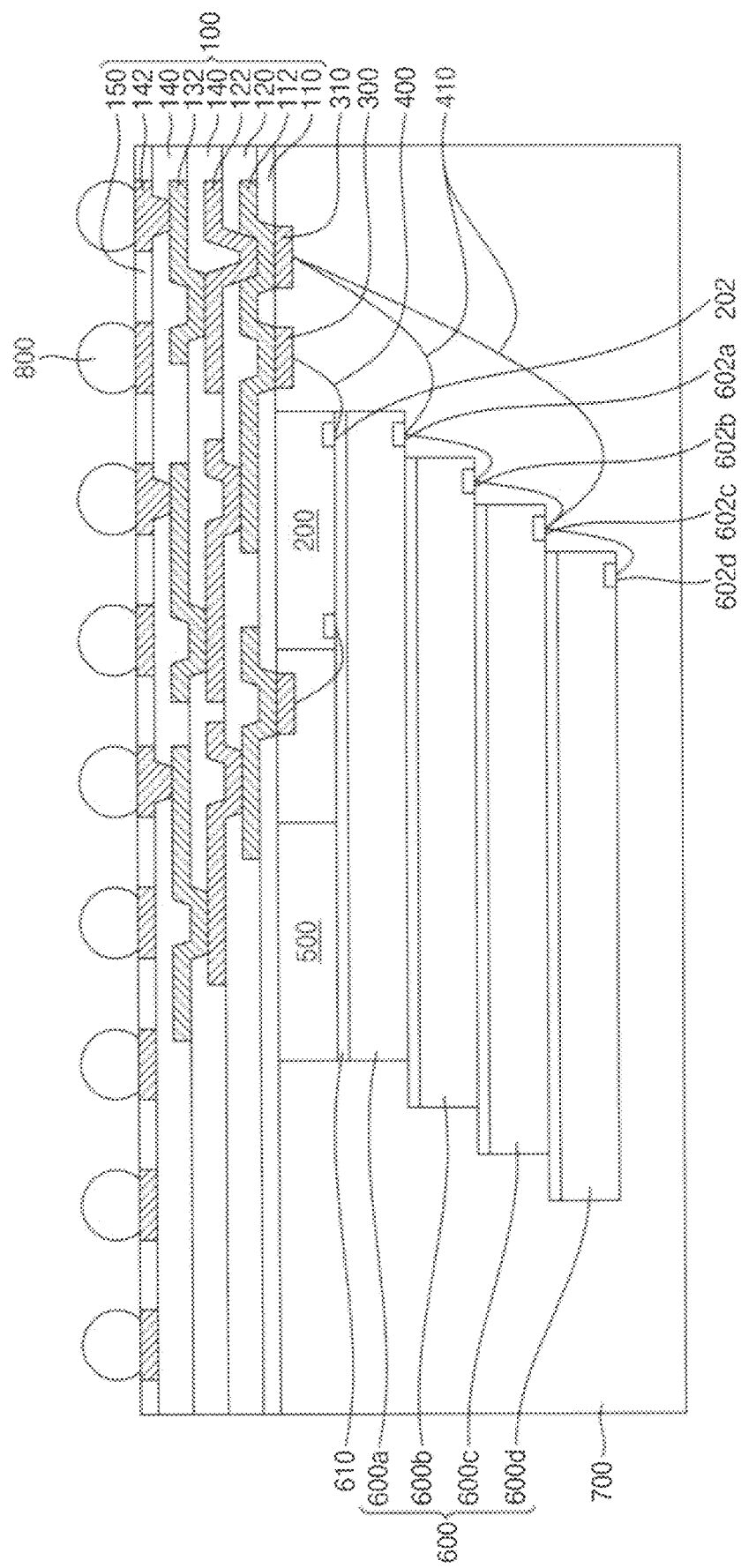

Referring to FIGS. 13 and 14, processes the same as or substantially similar to the processes described with reference to FIGS. 11 and 12 may be repeatedly performed to form a redistribution wiring layer 100 on the first surface 702 of the mold substrate 700, and then, outer connection members 800 may be formed on the redistribution wiring layer 100.

In some example embodiments, a second insulation layer 120 and second redistribution wirings 122 may be formed on the first insulation layer 110 and the first redistribution wirings 112. The second insulation layer 120 may have openings, which expose the first redistribution wirings 112 on the first insulation layer 110, respectively. The second redistribution wirings 122 may be formed on the second insulation layer 120 and on the respective first redistribution wirings 112.

Then, a third insulation layer 130 and third redistribution wirings 132 may be formed on the second insulation layer 120 and the second redistribution wirings 122. The third insulation layer 130 may have openings, which expose the second redistribution wirings 122 on the second insulation layer 120, respectively. The third redistribution wirings 132 may be formed on the third insulation layer 130 and on the respective second redistribution wirings 122.

Then, a fourth insulation layer 140 and fourth redistribution wirings 142 may be formed on the third insulation layer 130 and the third redistribution wiring 132. The fourth insulation layer 140 may have openings, which expose the third redistribution wirings 132 on the third insulation layer 130, respectively. The fourth redistribution wirings 142 may be formed the fourth insulation layer 140 on the respective third redistribution wirings 132.

Thus, the redistribution wiring layer 100, which includes redistribution wirings electrically connected to the wiring bonding pads 300 and 310 that function as the relay bonding pads, may be formed on the first surface 702 of the mold substrate 700. The number and the arrangement of the insulation layers included in the redistribution wiring layer in the figures are merely an example, and they may be variously modified.

Then, the outer connection members 800 electrically connected to the redistribution wirings may be formed on the redistribution wiring layer 100. For example, a solder ball as the outer connection member may be disposed on at least some of the fourth redistribution wirings 142. In such case, the portion of the fourth redistribution wirings 142 may serve as a landing pad (e.g., a package pad). Thus, the redistribution wiring layer 100 may be formed to include fan out type solder ball landing pads, which are formed on the mold substrate 700, and correspond to each die of a wafer by performing semiconductor manufacturing processes.

Then, a sawing process may be performed on the mold substrate 700 to form an individual fan out wafer level package, which include the mold substrate 700 having the wiring bonding pads 300 and 310, and the redistribution wiring layer 100 on the mold substrate 700.

Figure 15:
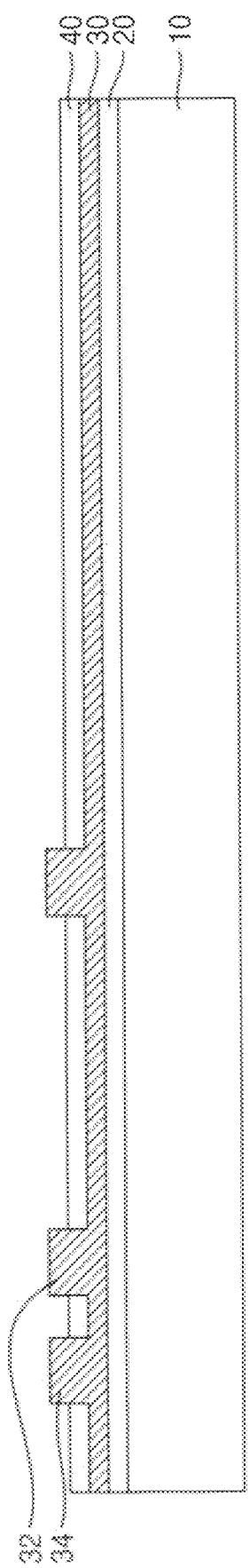
Figure 16:
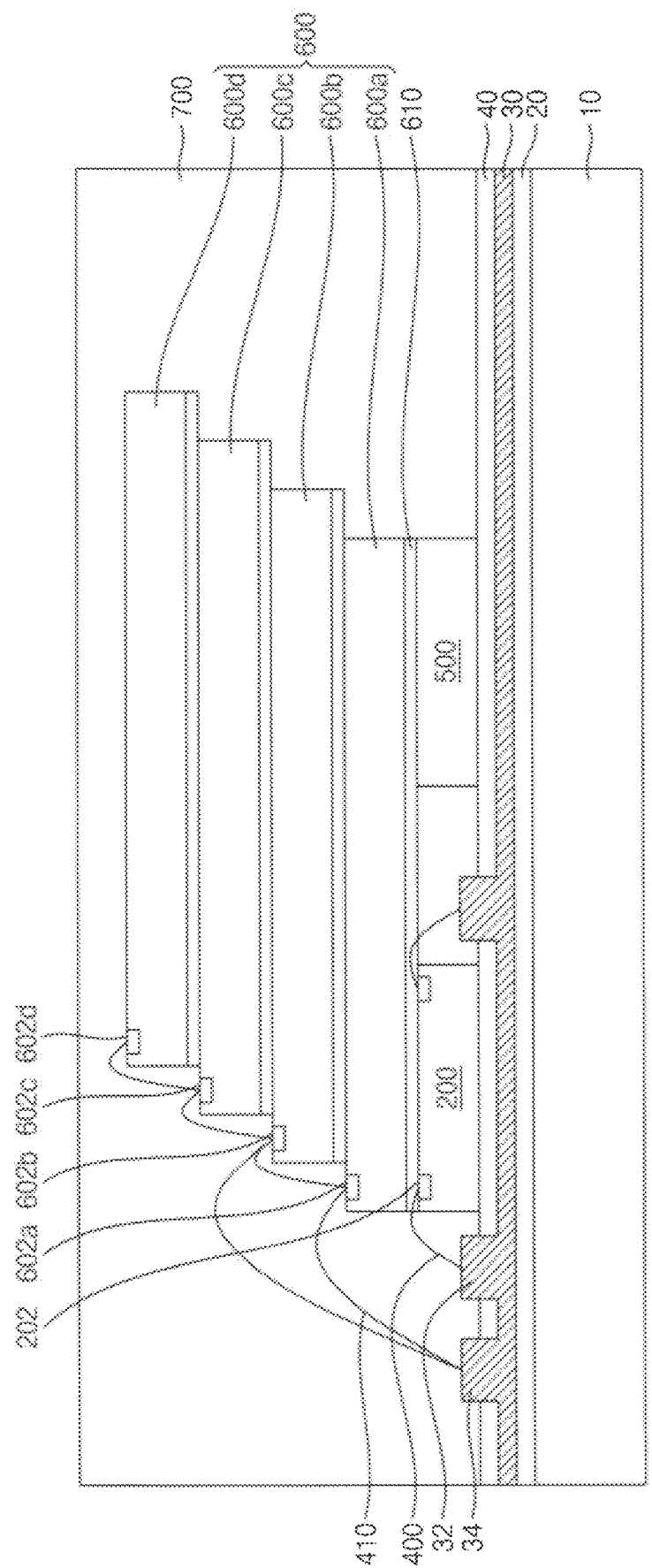

FIGS. 15 and 16 are cross-sectional views illustrating a method of manufacturing a semiconductor package in accordance with an example embodiment. The method may be substantially the same as or substantially similar to the method described with reference to FIGS. 2 to 14 except for steps of forming relay bonding pads. Thus, same reference numerals will be used to refer to the same or like elements and any further repetitive explanation concerning the above elements will be omitted.

Referring to FIG. 15, after a first separating layer 20 is formed on a dummy substrate 10, a metal pattern layer 30 having a plurality of protrusions 32 and 34 may be formed on the first separating layer 20. Then, a second separating layer 40 may be formed on the metal pattern layer 30.

In some example embodiments, the metal pattern layer 30 may be formed by, for example, a plating process, a deposition process and a patterning process, to be adhered on the first separating layer 20. The metal pattern layer 30 may have the protrusions 32 and 34 for forming a relay bonding pad portion. The metal pattern layer 30 may include a single metal layer or a plurality of metal layers. For example, the metal pattern layer 30 may include a metal (e.g., gold (Au), copper (Cu), or aluminum (Al)), or a metal alloy (e.g., nickel/gold (Ni/Au), or tin/copper (Sn/Cu)). The second separating layer 40 may be formed on the metal pattern layer 30, and may have openings exposing the protrusions 32 and 34 respectively. The first and second separating layer 20 and 40 may include a polymer tape for serving as a temporary adhesive.

Referring to FIG. 16, after a first semiconductor chip 200 is disposed on the second separating layer 40 on the dummy substrate 10, chip pads 202 of the first semiconductor chip 200 may be connected to the protrusions 32 of the metal pattern layer 30 by conductive connection members 400. Then, a support member 500 may be disposed adjacent to the first semiconductor chip 200 on the second separating layer 40.

In some example embodiments, the first semiconductor chip 200 may include a plurality of the chip pads 202 on a first surface. The first semiconductor chip 200 may be arranged on the dummy substrate 10 such that a second surface of the first semiconductor chip 200 opposite to the first surface faces the dummy substrate 10.

The conductive connection members 400 may be bonding wires. A wiring bonding process may be performed to electrically connect the chip pads 202 of the first semiconductor chip 200 and the protrusions 32 of the metal pattern layer 30 to each other with the bonding wires 400. Thus, end portions of the bonding wires 400 may be bonded to first surfaces of the protrusions 32 of the metal pattern layer 30.

Then, after a plurality of second semiconductor chips 600 is stacked on the first semiconductor chip 200 and the support member 500, chip pads 602a, 602b, 602c, 602d of the respective second semiconductor chip 600a, 600b, 600c, and 600d may be electrically connected to respective groups of the protrusions 34 of the metal pattern layer 30 by conductive connection members 410.

In some example embodiments, the second semiconductor chips 600a, 600b, 600c and 600d may include a plurality of the chip pads 602a, 602b, 602c and 602d on a first surface. The second semiconductor chips 600 may be arranged on the dummy substrate 10 such that second surfaces of the respective second semiconductor chips 600a, 600b, 600c, and 600d opposite to the first surface face the dummy substrate 10.

The conductive connection members 410 may be bonding wires. A wiring bonding process may be performed to electrically connect the chip pads 602a, 602b, 602c and 602d of the respective second semiconductor chips 600a, 600b, 600c, and 600d and the respective groups of the protrusions 34 of the metal pattern layer 30 to each other with the bonding wires 410. Thus, end portions of the bonding wire may be bonded to first surfaces of the protrusion 34 of the metal pattern layer 30.

Then, a mold substrate 700 may be formed on the dummy substrate 10 to cover the first semiconductor chip 200 and the second semiconductor chips 600.

Figure 17:
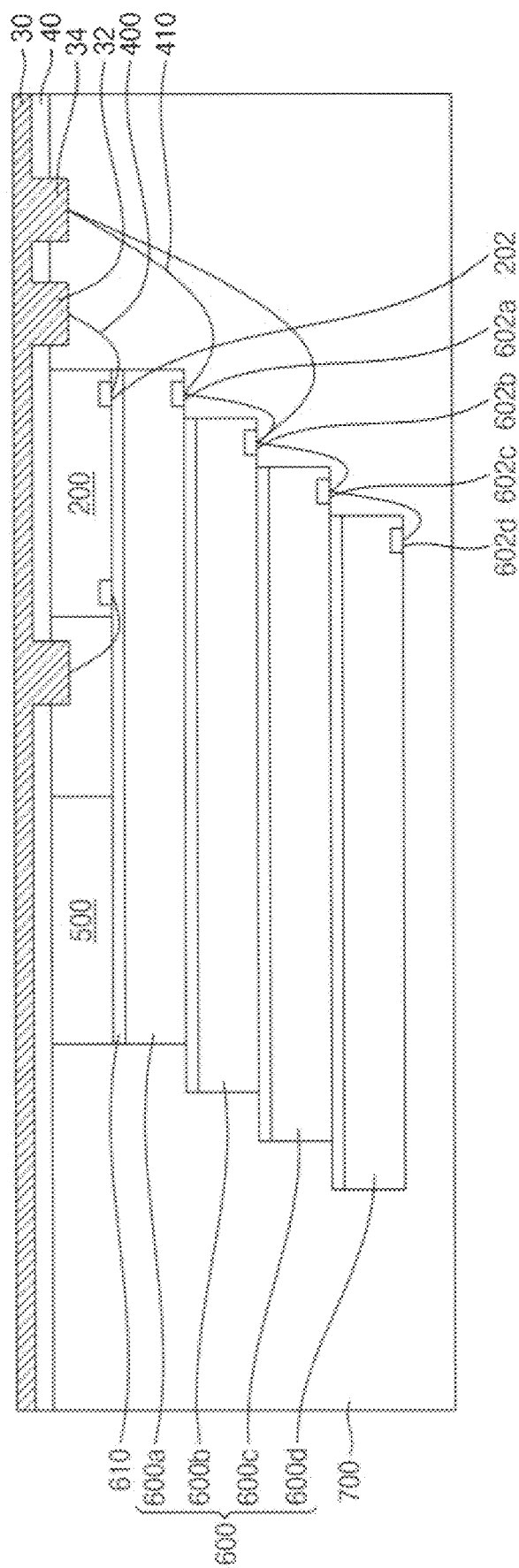
Figure 18:
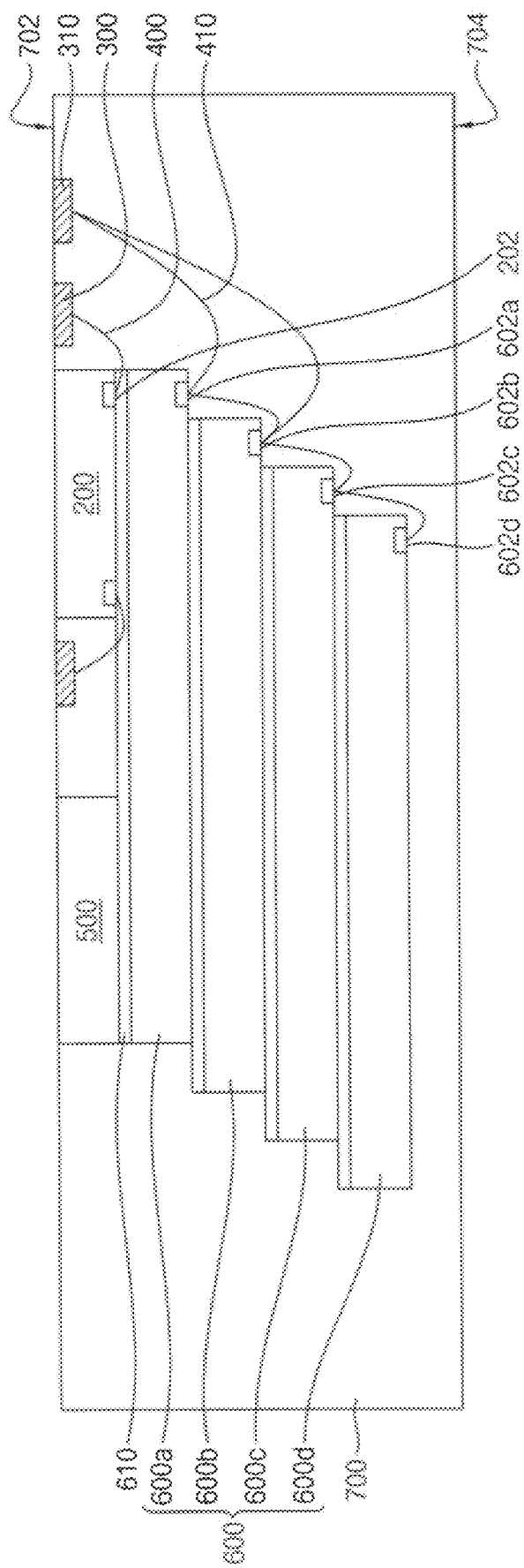

Referring to FIGS. 17 and 18, the structure including the mold substrate 700 formed therein in FIG. 16 may be reversed, and the dummy substrate 10 and the first separating layer 20 may be removed from the mold substrate 700. Then, the metal pattern layer 30 and the second separating layer 40 may be removed from the mold substrate 700 such that the protrusions 32 and 34 remain in the mold substrate 700.

In some example embodiments, the first separating layer 20 may be irradiated with light or may be heated to remove the dummy substrate 10 from the mold substrate 700. As the dummy substrate 10 is removed, the metal pattern layer 30 may be exposed.

Subsequently, portion of the metal pattern layer 30 is etched such that the protrusions remain, and the second separating layer 40 may be removed from the mold substrate 700. The remaining protrusions may be used as relay bonding pads 300 and 310 respectively. Accordingly, the relay bonding pads 300 and 310 may be exposed from a first surface 702 of the mold substrate 700.

Alternatively, the second separating layer 40 may be peeled off to remove the metal pattern layer 30 on the second separating layer 40 while leaving the protrusions. The metal pattern layer 30 may have a relatively small thickness such that only the protrusions 32 and 34 remain when the second separating layer 40 is peeled off.

Figure 19:
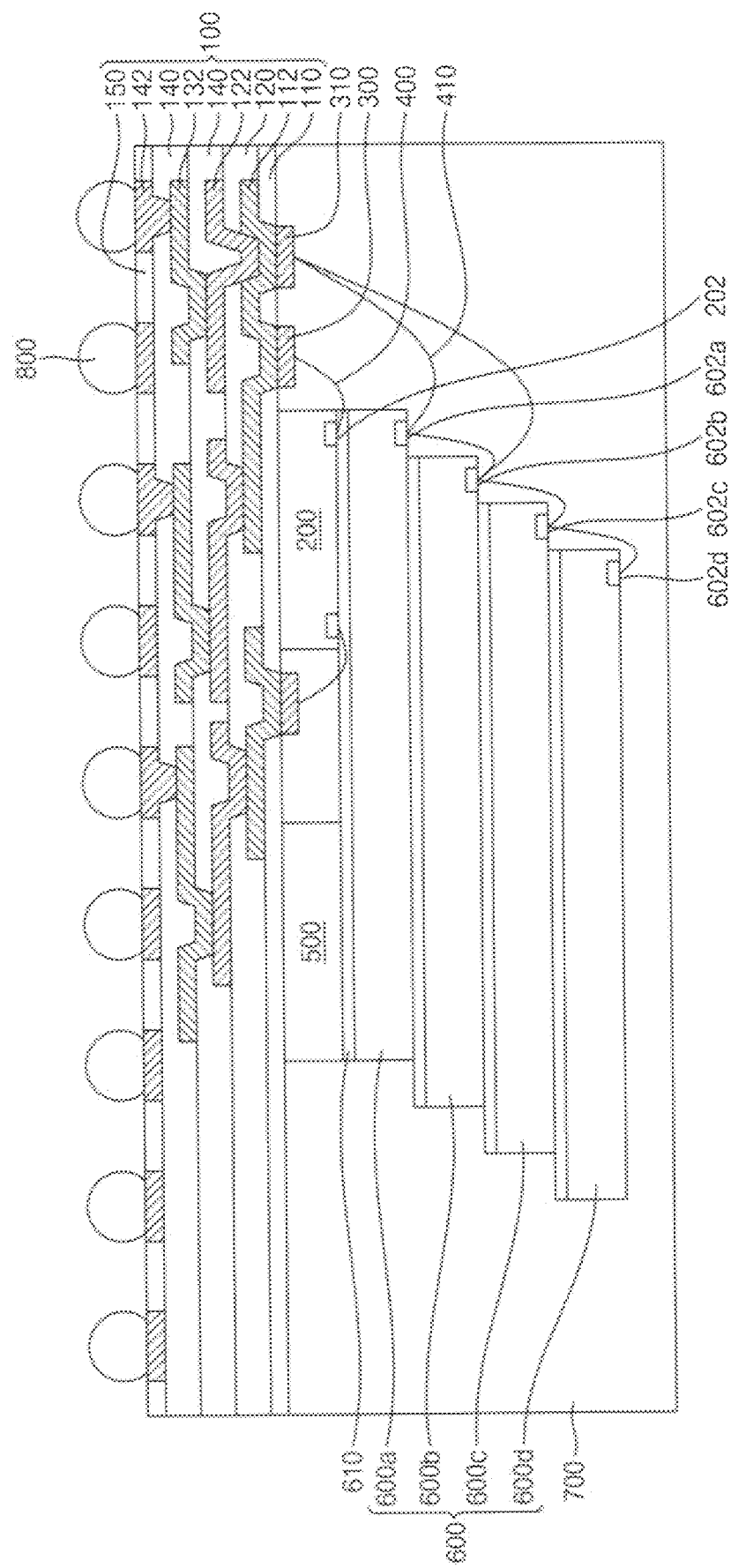

Referring to FIG. 19, a redistribution wiring layer 100 including redistribution wirings 112, 122, 132, and 142 electrically connected to the relay bonding pads 300 or 310 may be formed on the first surface 702 of the mold substrate 700, and then, an outer connection members 800 may be formed on the redistribution wiring layer 100 to be electrically connected to the redistribution wirings.

Then, a sawing process may be performed on the mold substrate 700 to form an individual fan out wafer level package, which includes the mold substrate 700 having the relay bonding pads 300 and 310, and the redistribution wiring layer 100 on the mold substrate 700.

Figure 20:
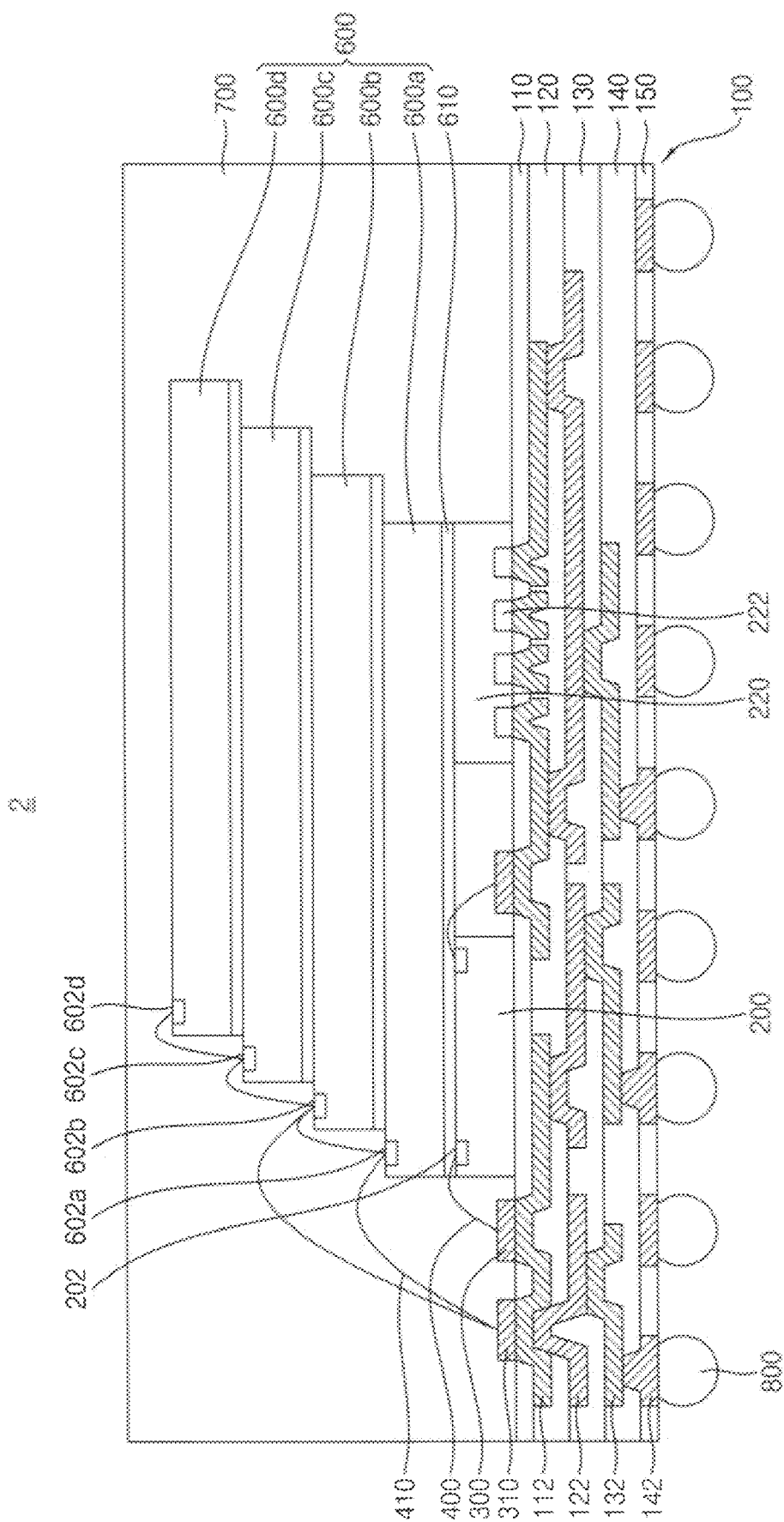

FIG. 20 is a cross-sectional view illustrating a semiconductor package in accordance with an example embodiment. The semiconductor package may be substantially the same as or substantially similar to the semiconductor package as described with reference to FIG. 1, except for an addition of a semiconductor chip including at least one chip pad directly connected to a redistribution wiring. Thus, same reference numerals will be used to refer to the same or like elements and any further repetitive explanation concerning the above elements will be omitted.

Referring to FIG. 20, a semiconductor package 2 may include a mold substrate 700, a first semiconductor chip 200, a second semiconductor chip 220, and a plurality of third semiconductor chips 600 disposed in the mold substrate 700, wiring bonding pads 300 and 310 formed in a first surface 702 of the mold substrate 700, and a redistribution wiring layer 100 covering the first surface 702 of the mold substrate 700 and including redistribution wirings connected to the wiring bonding pads 300 or 310. The semiconductor package 2 may further include outer connection members 800 disposed on the redistribution wiring layer 100.

In some example embodiments, the first semiconductor chip 200 may include a plurality of chip pads 202 on a first surface. The first semiconductor chip 200 may be received in the mold substrate 700 such that a second surface of the first semiconductor chip 200 opposite to the first surface faces the redistribution wiring layer 100. The second surface of the first semiconductor chip 200 may be exposed from the first surface 702 of the mold substrate 700.

The second semiconductor chip 220 may include a plurality of chip pads 222 on a first surface. The second semiconductor chip 220 may be received in the mold substrate 700 such that the first surface of the second semiconductor chip 220 faces the redistribution wiring layer 100. The first surface of the second semiconductor chip 222 and the chip pads 222 may be exposed from the first surface 702 of the mold substrate 700. The second semiconductor chip 220 may have a height from the redistribution wiring layer 100 the same as that of the first semiconductor chip 200.

A plurality of the third semiconductor chips 600 may be disposed on the first semiconductor chip 200 and the second semiconductor chip 220. The third semiconductor chips 600a, 600b, 600c, and 600d may include a plurality of chip pads 602a, 602b, 602c and 602d on their respective first surfaces. The third semiconductor chips 600 may be received in the mold substrate 700 such that a second surface of the second semiconductor chip 600 opposite to the first surface faces the redistribution wiring layer 100.

For example, the second semiconductor chip 220 may be a logic chip including a logic circuit. The first semiconductor chip 200 and the third semiconductor chips 600 may be memory chips including memory circuit. The number, the size, the arrangement, etc., of the first to third semiconductor chips may not be limited thereto.

The wiring bonding pads 300 may be formed in the first surface 702 of the mold substrate 700 and may be connected to end portions of the bonding wires 400, respectively. Accordingly, the wiring bonding pads 300 may be electrically connected to the chip pads 202 of the first semiconductor chip 200, respectively, by the bonding wires 400.

The wiring bonding pads 310 may be formed in the first surface 702 of the mold substrate 700 and may be connected to end portions of the bonding wires 410, respectively. Accordingly, the wiring bonding pads 310 may be electrically connected to the chip pads 602a, 602b, 602c, and 602d of the third semiconductor chips 600, respectively, by the bonding wires 410.

The redistribution wirings of the redistribution wiring layer 100 may make contact with the wiring bonding pads 300 or 310, and the chip pads 222 of the second semiconductor chip exposed from the first surface 702 of the mold substrate 700.

For example, the redistribution wiring layer 100 may include a first insulation layer 110 formed on the first surface 702 of the mold substrate 700, first openings exposing the wiring bonding pads 300 and 310, and first redistribution wirings 112 formed on the first insulation layer 110 and electrically connected to the chip pads 222 of the second semiconductor chip 220. At least portions of the first redistribution wirings 112 may directly contact the wiring bonding pads 300 and 310 and the chip pad 222 of the second semiconductor chip 220, respectively, through the first openings.

Further, the redistribution wiring layer 100 may further include second, third, fourth, and fifth insulation layers 120, 130, 140 and 150, and second, third, and fourth redistribution wirings 122, 132, and 142 sequentially formed on the first insulation layer 110.

Outer connection members 800 may be disposed on at least portions of the fourth redistribution wirings 142. For example, the outer connection member 800 may include a solder ball.

Hereinafter, a method of manufacturing the semiconductor package in FIG. 20 will be explained.

Figure 22:
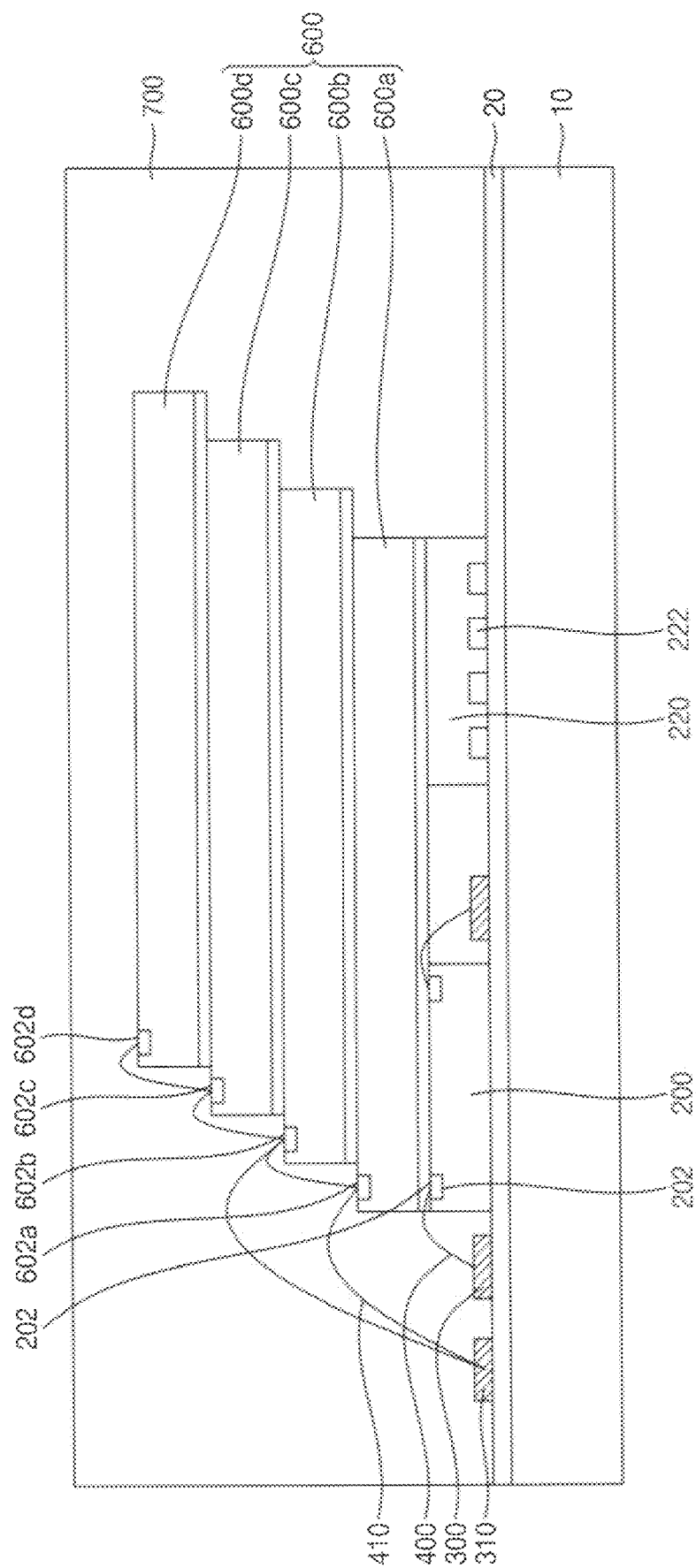
Figure 23:
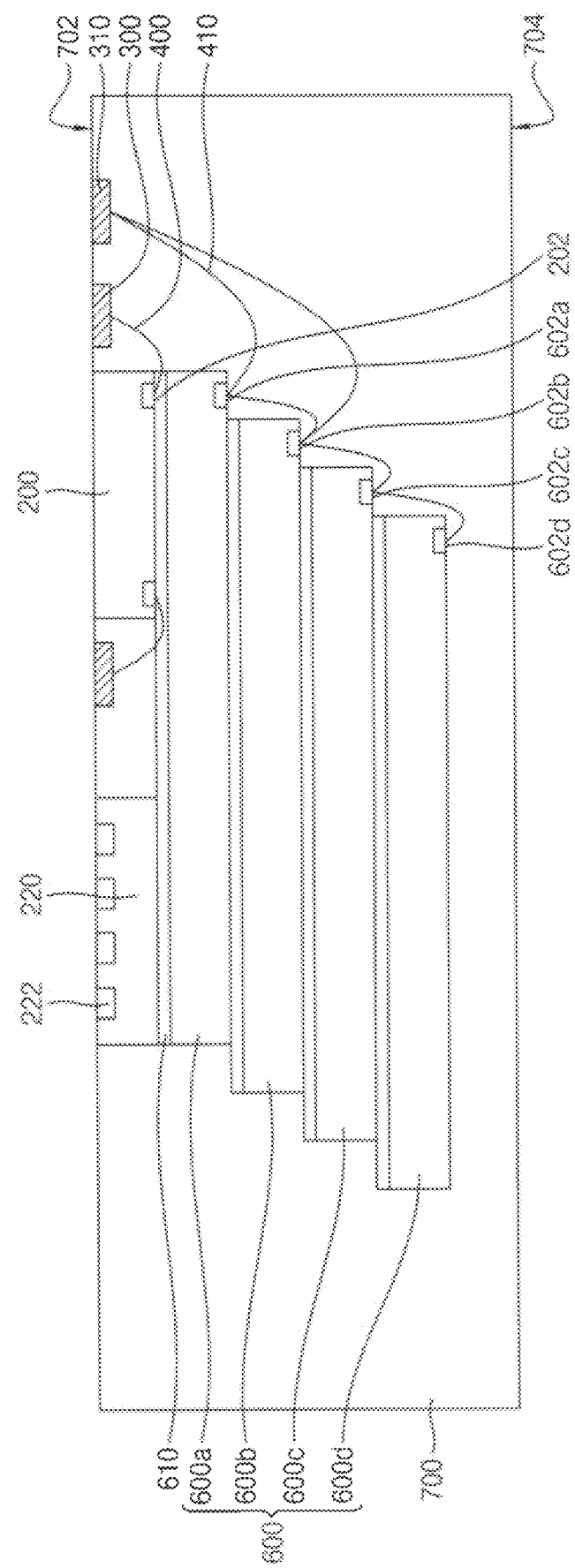
Figure 24:
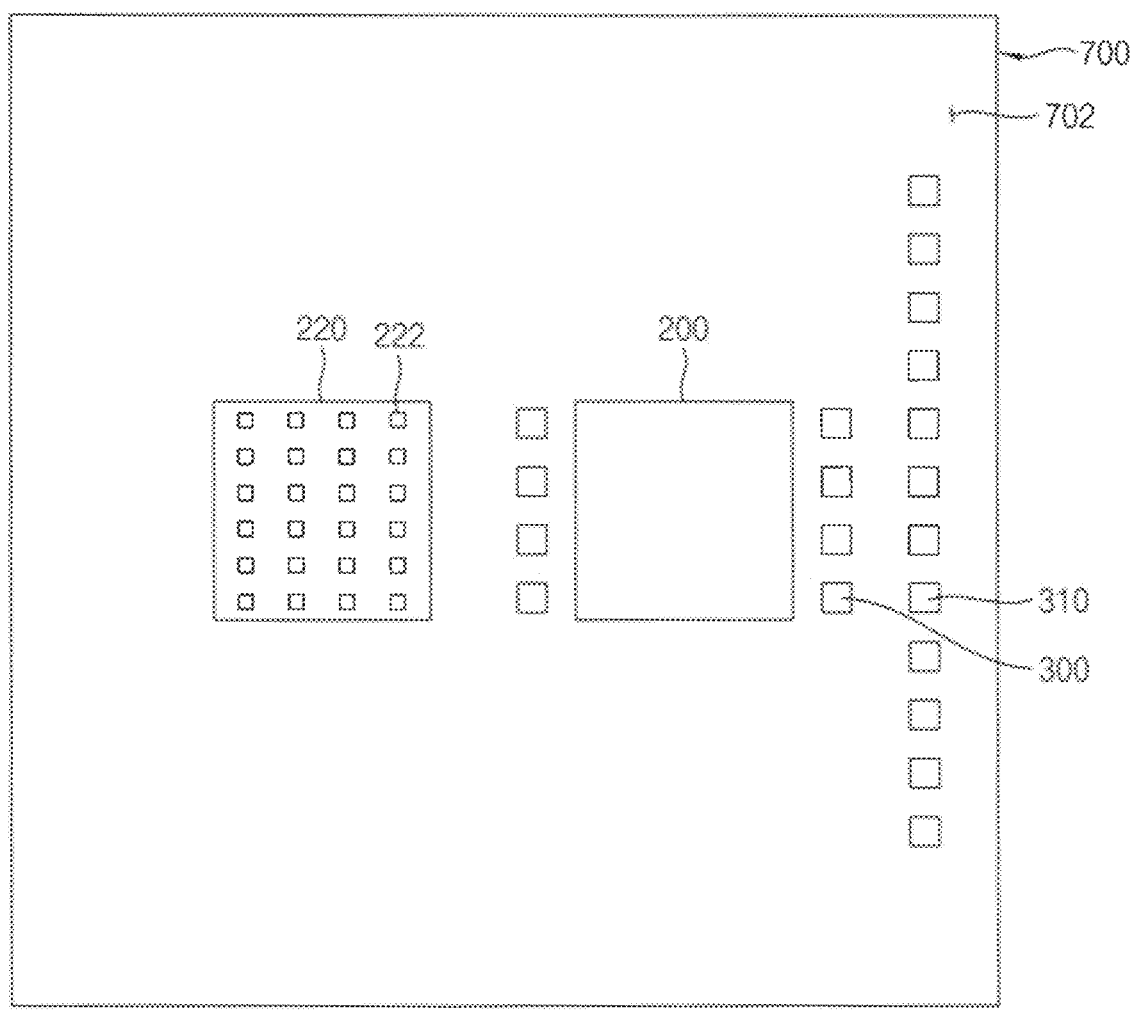

FIGS. 21 to 27 are views illustrating a method of manufacturing a semiconductor package in accordance with an example embodiment. FIGS. 21, 22, 23, 25, 26 and 27 are cross-sectional views illustrating the method of manufacturing a semiconductor package. FIG. 24 is a plan view of FIG. 23.

Figure 21:
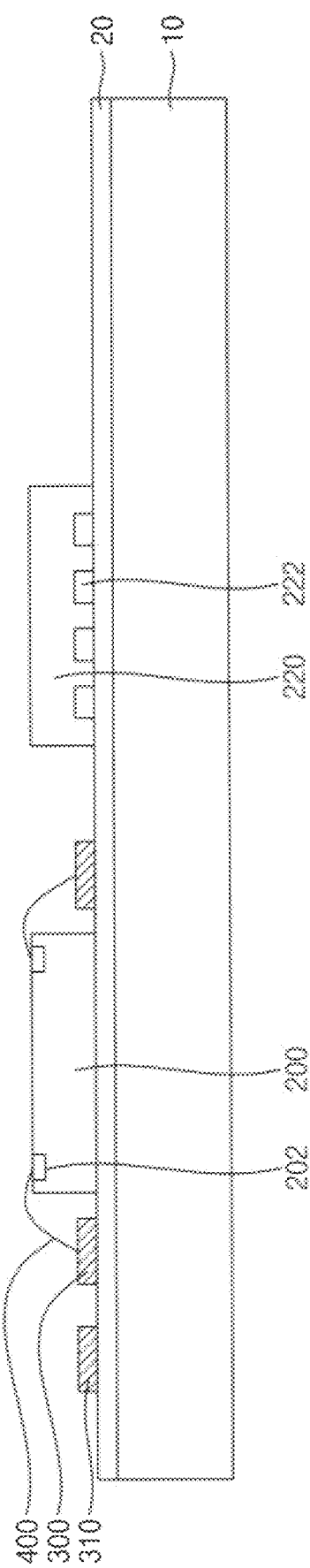

Referring to FIG. 21, a plurality of relay bonding pads 300, 310 and a first semiconductor chip 200 may be arranged on a separating layer 20 on a dummy substrate 10, and then, chip pads 202 of the first semiconductor chip 200 may be connected to the relay bonding pads 300, respectively, by conductive connection members 400. Then, a second semiconductor chip 220 may be arranged adjacent to the first semiconductor chip 200 on the separating layer 20.

In some example embodiments, the first semiconductor chip 200 may include a plurality of the chip pads 202 on a first surface (e.g., an active surface). The first semiconductor chip 200 may be arranged on the dummy substrate 10 such that a second surface of the first semiconductor chip 200 opposite to the first surface faces the dummy substrate 10.

The conductive connection members 400 may be bonding wires. In such case, the relay bonding pads 300 may be wiring bonding pads. A wiring bonding process may be performed to electrically connect the chip pads 202 of the first semiconductor chip 200 and the wiring bonding pads 300 to each other with the bonding wires 400, respectively. Thus, end portions of the bonding wires 400 may be bonded to first surfaces of the wiring bonding pads 300.

In some example embodiments, the second semiconductor chip 220 may include a plurality of the chip pads 222 on a first surface (e.g., an active surface). The second semiconductor chip 220 may be arranged on the dummy substrate 10 such that the first surface of the second semiconductor chip 220 faces the dummy substrate 10.

For example, the first semiconductor chip 200 may be a memory chip including a memory circuit, and the second semiconductor chip 220 may be a logic chip including a logic circuit. The logic chip may be a controller for controlling the memory chip.

Referring to FIG. 22, after a plurality of third semiconductor chips 600 are stacked on the first semiconductor chip 200 and the second semiconductor chip 220, chip pads 602a, 602b, 602c, 602d of the third semiconductor chips 600 may be electrically connected to the relay bonding pads 310, respectively, by conductive connection members 410. Then, a mold substrate 700 may be formed on the dummy substrate 10 to cover the first semiconductor chip 200, the second semiconductor chip 220 and the third semiconductor chips 600.

In some example embodiments, the third semiconductor chips 600a, 600b, 600c and 600d may include a plurality of the chip pads 602a, 602b, 602c and 602d on respective first surfaces, (e.g., respective active surfaces). The third semiconductor chips 600 may be arranged on the dummy substrate 10 such that a second surface of the third semiconductor chip 600 opposite to the first surface faces the dummy substrate 10.

The conductive connection members 410 may be bonding wires. In such case, the relay bonding pads 310 may be wiring bonding pads. A wiring bonding process may be performed to electrically connect the chip pads 602a, 602b, 602c, and 602d of the third semiconductor chips 600 and the wiring bonding pads 310 to each other with the bonding wires 410. Thus, end portions of the bonding wires 410 may be bonded to first surfaces of the wiring bonding pads 310.

Referring to FIGS. 23 and 24, the structure including the mold substrate 700 formed in FIG. 22 may be reversed, and then, the dummy substrate 10 and the separating layer 20 may be removed from the mold substrate 700.

In some example embodiments, the separating layer 20 may be irradiated with light or may be heated to remove the dummy substrate 10 from the mold substrate 700. As the dummy substrate 10 is removed, the relay bonding pads 300 and 310 and the chip pads 222 of the second semiconductor chip 220 may be exposed from the first surface 702 of the mold substrate 700. Further, the second surface of the first semiconductor chip and the first surface of the second semiconductor chip 220 may be exposed from the first surface 702 of the mold substrate 700.

Figure 25:
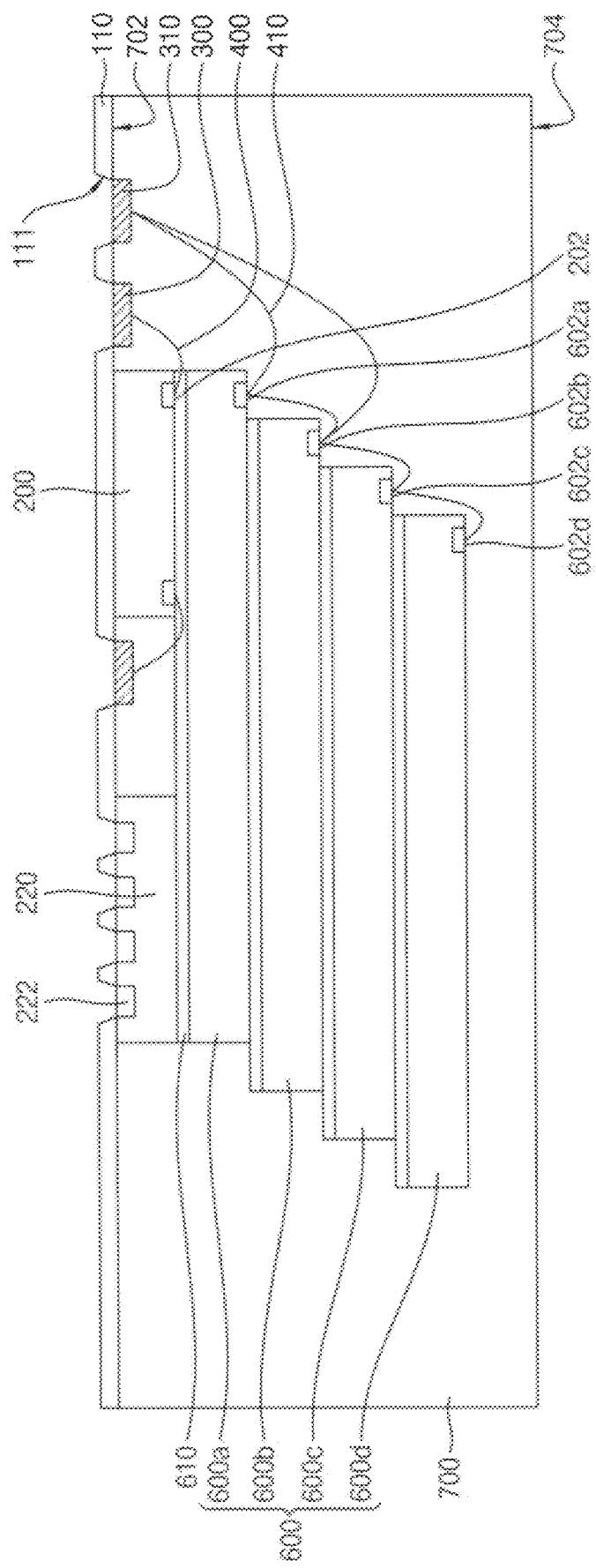

Referring to FIG. 25, a first insulation layer 110 having first openings 111, which expose the wiring bonding pads 300 and 310 and the chip pads 222 of the second semiconductor chip 220, respectively may be formed on the first surface 702 of the mold substrate 700.

In some example embodiments, after the first insulation layer 110 is formed to cover the first surface 702 of the mold substrate 700, the second surface of the first semiconductor chip 200, the first surface of the second semiconductor chip 220, the wiring bonding pads 300, 310 and the chip pads 222 of the second semiconductor chip 220, the first insulation layer 110 may be patterned to form the first openings 111 to expose the wiring bonding pads 300, 310 and the chip pads 222 of the second semiconductor chip 220, respectively.

For example, the first insulation layer 110 may include polymer, a dielectric material, etc. The first insulation layer 110 may be formed by a vapor deposition process, a spin coating process, etc.

Figure 26:
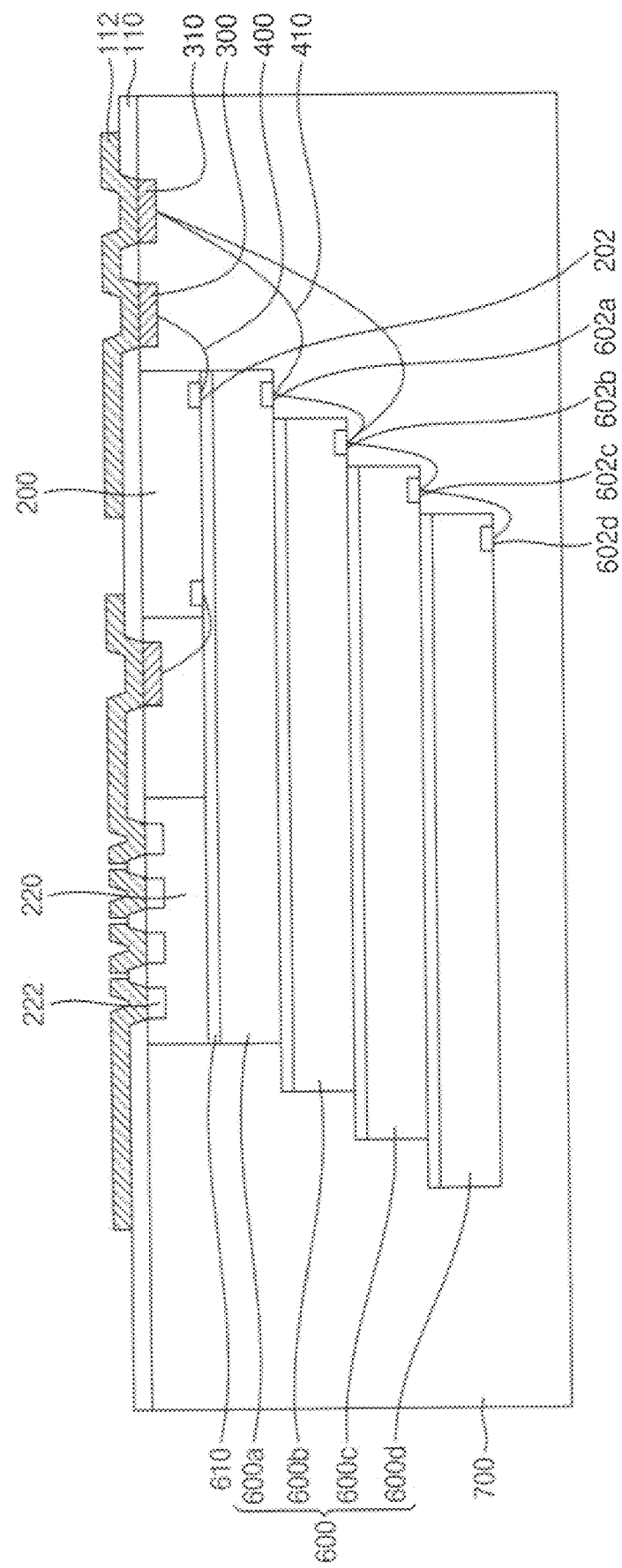

Referring to FIG. 26, first redistribution wirings 112 may be formed on the first insulation layer 110 to make contact with the wiring bonding pads 300 and 310 and the chip pads 222 of the second semiconductor chip 220 through the first openings 111, respectively.

In some example embodiments, the first redistribution wirings 112 may be formed on a portion of the first insulation layer 110, the wiring bonding pads 300 and 310, and the chip pads 222 of the second semiconductor chip 220. The first redistribution wirings 112 may be formed by forming a seed layer on at least a portion of the first insulation layer 110 and on the first openings 111, patterning the seed layer, and performing an electroplating process.

Accordingly, the first redistribution wirings 112 may make contact with the wiring bonding pads 300 and 310 and the chip pads 222 of the second semiconductor chip 220 through the first openings 111, respectively.

Figure 27:
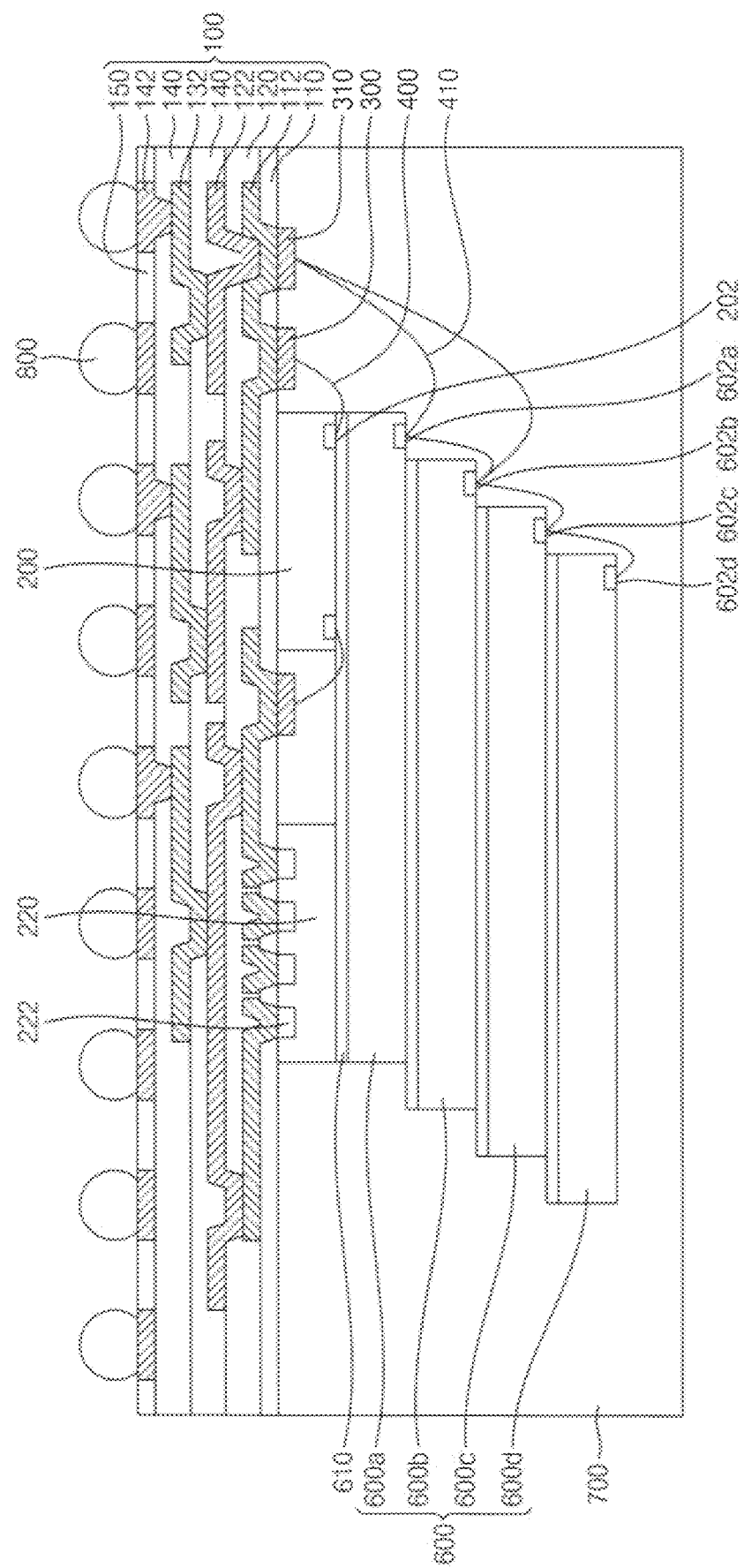

Referring to FIG. 27, processes the same as or substantially similar to the processes described with reference to FIGS. 25 and 26 may be repeatedly performed to form a redistribution wiring layer 100 on the first surface 702 of the mold substrate 700, and then, outer connection members 800 may be formed on the redistribution wiring layer 100.

In some example embodiments, the redistribution wiring layer 100 including redistribution wirings, which are electrically connected to the wiring bonding pads 300 and 310 as relay bonding pads and the chip pads 222 of the second semiconductor chip 220, respectively, may be formed on the first surface 702 of the mold substrate 700. Thus, the redistribution wiring layer 100 may be formed to include fan out type solder ball landing pads which are formed on the mold substrate 700, and correspond to each die of a wafer by performing semiconductor manufacturing processes.

Then, the outer connection members 800 may be formed on the redistribution wiring layer 100 to be electrically connected to the redistribution wirings.

Then, a sawing process may be performed to divide the mold substrate 700 individually to complete a fan out wafer level package including the mold substrate 700 having the wiring bonding pads 300 and 310, and the redistribution wiring layer 100 on the mold substrate 700.

Figure 28:
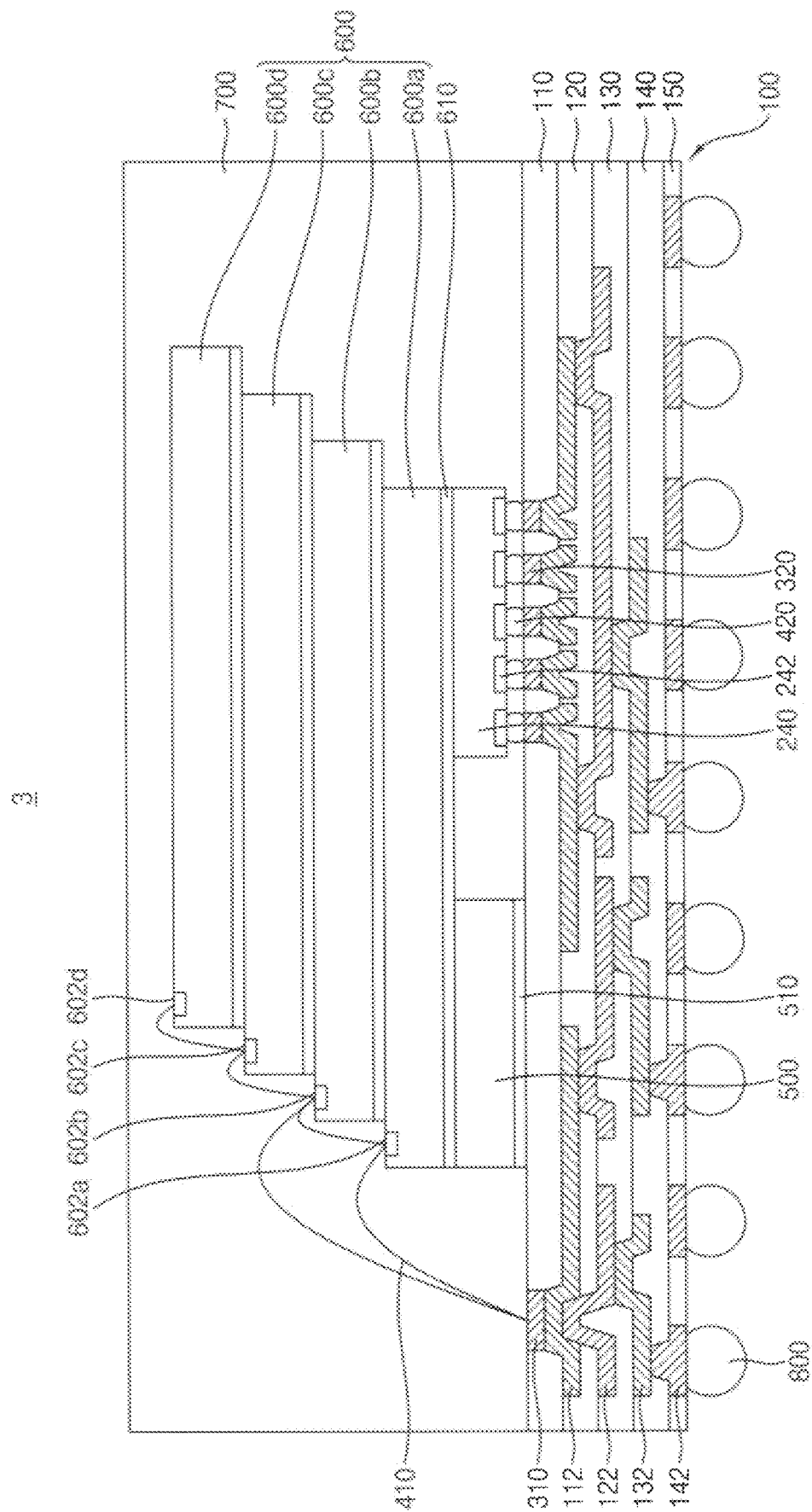

FIG. 28 is a cross-sectional view illustrating a semiconductor package in accordance with an example embodiment. The semiconductor package may be substantially the same as or substantially similar to the semiconductor package as described with reference to FIG. 1, except for an addition of a semiconductor chip mounted in a flip chip bonding manner. Thus, same reference numerals will be used to refer to the same or like elements and any further repetitive explanation concerning the above elements will be omitted.

Referring to FIG. 28, a semiconductor package 3 may include a mold substrate 700, a first semiconductor chip 240 and a plurality of second semiconductor chips 600 disposed in the mold substrate 700, wiring bonding pads 310 formed in a first surface 702 of the mold substrate 700, bump bonding pads 320 in the first surface 702 of the mold substrate 700, and a redistribution wiring layer 100 covering the first surface 702 of the mold substrate 700 and including redistribution wirings connected to the wiring bonding pads 310. The semiconductor package 3 may further include a support member 500 disposed in the redistribution wiring layer 100. The semiconductor package 3 may further include outer connection members 800 disposed on the redistribution wiring layer 100.

In some example embodiments, the first semiconductor chip 240 may include a plurality of chip pads 242 on a first surface. The first semiconductor chip 240 may be received in the mold substrate 700 such that the first surface of the first semiconductor chip 240 faces the redistribution wiring layer 100. The first semiconductor chip 240 may mounted in a flip chip bonding manner in the mold substrate 700. Conductive bumps 420 may be disposed on the chip pads 242, and the conductive bumps 420 may be disposed on the bump bonding pads 320. The bump bonding pads 320 may be exposed from the first surface 702 of the mold substrate 700.

The support member 500 may function to support a plurality of the second semiconductor chips 600. The support member 500 may have a height from the redistribution wiring layer 100 the same as that of the first semiconductor chip 240.

A plurality of the second semiconductor chips 600 may be disposed on the first semiconductor chip 240 and the support member 500. The second semiconductor chips 600a, 600b, 600c, and 600d may include a plurality of chip pads 602a, 602b, 602c and 602d on their respective first surfaces. The second semiconductor chips 600 may be received in the mold substrate 700 such that respective second surfaces of the second semiconductor chips 600a, 602b, 602c and 602d opposite to the corresponding first surface face the redistribution wiring layer 100.

For example, the first semiconductor chip 240 may be a logic chip including a logic circuit, and the second semiconductor chips 600 may be a memory chip including a memory circuit. The logic chip may be a controller for controlling the memory chip. The number, the size, the arrangement, etc., of the first and second semiconductor chips may not be limited thereto.

The wiring bonding pads 310 may be formed in the first surface 702 of the mold substrate 700 and may be connected to end portions of bonding wires 410. Accordingly, the wiring bonding pads 310 may be electrically connected to the chip pads of the second semiconductor chips 600 by the bonding wires 410.

For example, first surfaces of the wiring bonding pads 310 may be connected to end portions of the bonding wires 410, respectively, and second surfaces of the wiring bonding pads 310 opposite to the corresponding first surfaces may be exposed from the first surface 702 of the mold surface 700 and may be connected to the redistribution wiring. The second surfaces of the wiring bonding pads 310 may be coplanar with the first surface 702 of the mold substrate 700.

The bump bonding pads 320 may be formed in the first surface 702 of the mold substrate 700 and may be connected to the conductive bumps 420, respectively. Accordingly, the bump bonding pads 320 may be electrically connected to the chip pads 242 of the first semiconductor chip 240 by the conductive bumps 420.

The redistribution wirings of the redistribution wiring layer 100 may make contact with the wiring bonding pads 310 and the bump bonding pads 320 exposed from the first surface 702 of the mold substrate 700.

For example, the redistribution wiring layer 100 may include a first insulation layer 110 formed on the first surface 702 of the mold substrate 700, first openings exposing the wiring bonding pads 310 and the bump bonding pads 320, and first redistribution wirings 112 formed on the first insulation layer 110. At least portions of the first redistribution wirings 112 may directly contact the wiring bonding pads 310 or the bump bonding pads 320 through the first openings. The first redistribution wiring 112 may make contact with the second surfaces of the wiring bonding pads 310, the first surface of the wiring bonding pad 310 may be covered by the mold substrate 700, and side surfaces of the wiring bonding pad 310 may be covered by the first insulation layer 110.

Further, the redistribution wiring layer 100 may further include second, third, fourth and fifth insulation layers 120, 130, 140 and 150 and second, third and fourth redistribution wirings 122, 132 and 142 sequentially formed on the first insulation layer 110.

Outer connection members 800 may be disposed on portions of the fourth redistribution wirings 142. For example, the outer connection member 800 may include a solder ball.

Hereinafter, a method of manufacturing the semiconductor package in FIG. 28 will be explained.

Figure 29:
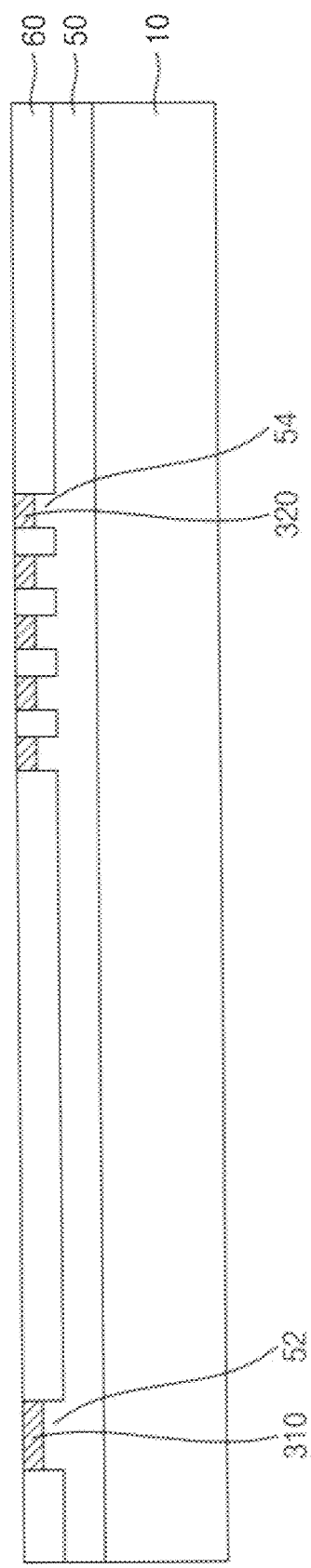
Figure 30:
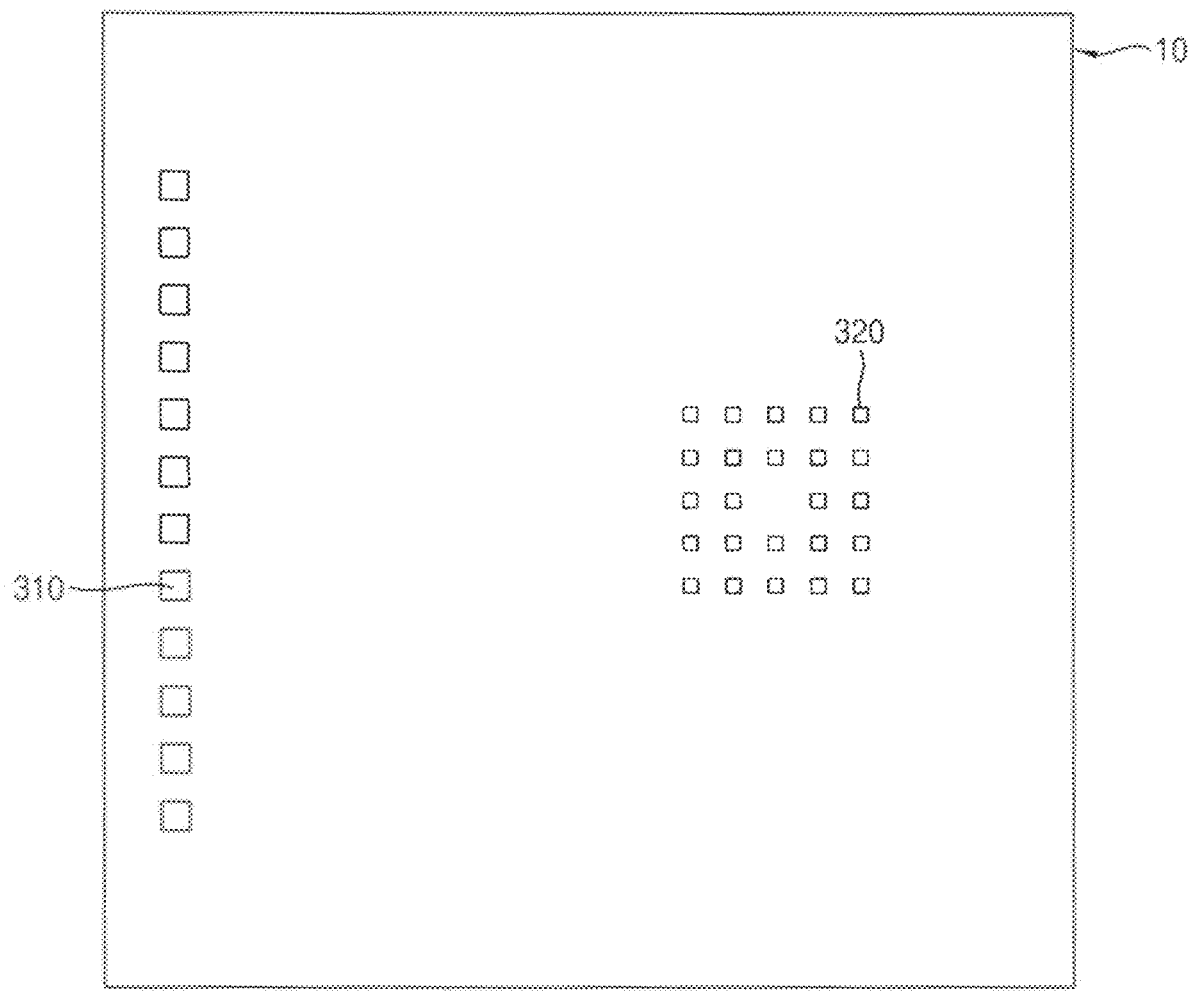

FIGS. 29 to 37 are views illustrating a method of manufacturing a semiconductor package in accordance with an example embodiment. FIGS. 29, 31, 32, 33, 34, 35, 36 and 37 are cross-sectional views illustrating the method of manufacturing a semiconductor package. FIG. 30 is a plan view of FIG. 29.

Referring to FIGS. 29 and 30, after a metal layer 50 is formed on a dummy substrate 10, a plurality of relay bonding pads 310, 320 may be formed on the metal layer 50.

In some example embodiments, the metal layer 50 may be formed by, for example, a plating process, a deposition process and a patterning process, and then may be adhered on the dummy substrate 10. The metal layer 50 may have protrusions 52 and 54 for forming relay bonding pad portions. The metal layer 50 may include a single metal layer or a plurality of metal layers. For example, the metal layer 50 may include a metal (e.g., gold (Au), copper (Cu), or aluminum (Al)), or a metal alloy (e.g., nickel/gold (Ni/Au)

or tin/copper (Sn/Cu)). An insulation layer 60 may be formed on the metal layer 60, and may have openings exposing the protrusions 52 and 54 respectively. The insulation layer 60 may include an insulating material (e.g., polymer tape or solder resist).

Then, the relay bonding pads 310 and 320 may be formed on the protrusions 52 and 54, respectively. The relay bonding pads 310 and 320 may include a different metal from the metal layer 50. For example, when the metal layer 50 may include copper (Cu), the relay bonding pads 310 and 320 may include gold (Au) or nickel/gold (Ni/Au).

The relay bonding pads 320 may be bump bonding pads. The relay bonding pads 320 may be metal bonding parts to be bonded to conductive bumps for electrical connection to a first semiconductor chip which will be stacked later. The relay bonding pads 310 may be wiring bonding pads. The relay bonding pad 310 may be metal bonding parts to be bonded to bonding wires for electrical connection to second semiconductor chips which will be stacked later.

Alternatively, the step of forming the insulation layer 60 may be omitted, and the relay bonding pads may be formed on the metal layer 50 in desired (or alternatively, predetermined) positions.

Figure 31:
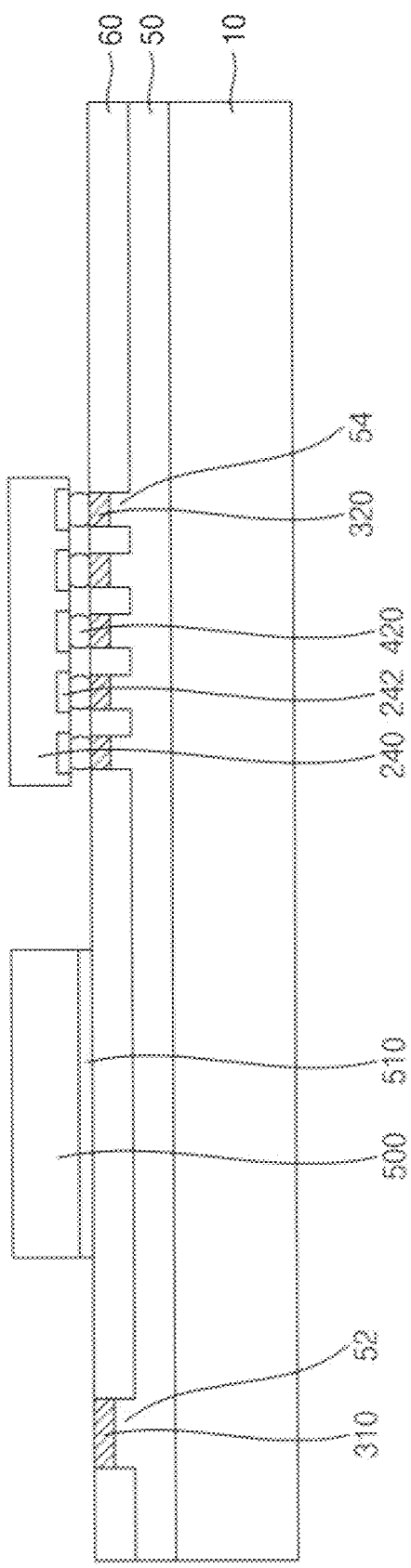

Referring to FIG. 31, after a first semiconductor chip 240 is disposed on the metal layer 50 on the dummy substrate 10, chip pads 242 of the first semiconductor chip 240 may be connected to the relay bonding pads 320 by conductive connection members 420. Then, a support member 500 may be disposed adjacent to the first semiconductor chip 240 on the metal layer 50 on the dummy substrate 10.

In some example embodiments, the first semiconductor chip 240 may include a plurality of the chip pads 242 on a first surface. The first semiconductor chip 240 may be arranged on the dummy substrate 10 such that the first surface of the first semiconductor chip 240 faces the dummy substrate 10. For example, the first semiconductor chip 240 may be mounted on the metal layer 50 in a flip chip bonding manner.

The conductive connection members 420 may be conductive bumps. In such case, the relay bonding pads 320 may be bump bonding pads. After the conductive bumps 420 are formed on the chip pads 242 on the first surface of the first semiconductor chip 240, the first semiconductor chip 240 may be mounted on the dummy substrate 10 via the conductive bumps 420. The conductive bumps 420 may be disposed on the bump bonding pads 320, respectively. Then, the conductive bumps 420 may be adhered to the bump bonding pads 320 by a reflow process to mount the first semiconductor chip 240 on the dummy substrate 10.

The support member 500 may be stacked on the insulation layer 60 by an adhesive layer 510. Alternatively, another semiconductor chip may be disposed instead of the support member 500.

Figure 32:
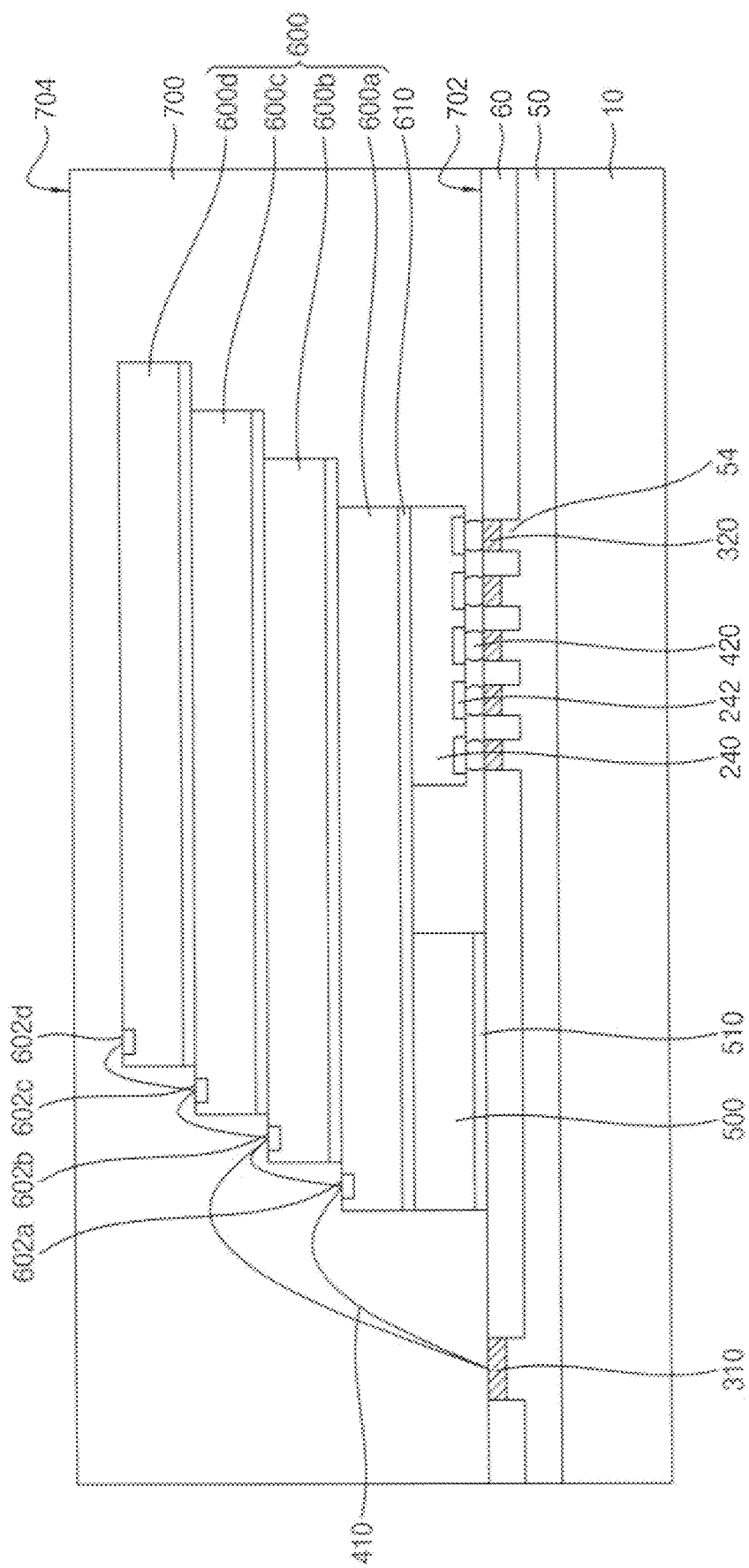

Referring to FIG. 32, after a plurality of second semiconductor chips 600 is stacked on the first semiconductor chip 240 and the support member 500, chip pads 602a, 602b, 602c, 602d of the second semiconductor chip 600 may be electrically connected to the relay bonding pads 310 by conductive connection members 410. Then, a mold substrate 700 may be formed on the dummy substrate 10 to cover the first semiconductor chip 240 and the second semiconductor chips 600.

In some example embodiments, the second semiconductor chips 600a, 600b, 600c and 600d may include a plurality of the chip pads 602a, 602b, 602c and 602d on respective first surfaces (e.g., respective active surfaces). The second semiconductor chips 600a, 600b, 600c, and 600d may be arranged on the dummy substrate 10 such that second surfaces of the second semiconductor chip 600 opposite to the corresponding first surfaces face the dummy substrate 10.

A plurality of the second semiconductor chips 600a, 600b, 600c and 600d may be stacked sequentially by adhesive layers 610. The second semiconductor chips 600a, 600b, 600c and 600d may be staked in a cascade structure. The second semiconductor chips may be offset to each other. An area of the second semiconductor chip is greater than an area of the first semiconductor chip or the support member when viewed in a plan view.

The conductive connection members 410 may be bonding wires. In such case, the relay bonding pads 310 may be wiring bonding pads. A wiring bonding process may be performed to electrically connect the chip pads of the second semiconductor chips 600 and the wiring bonding pads 310 to each other with the bonding wires 410. Thus, end portions of the bonding wires may be bonded to first surfaces of the wiring bonding pads 310, respectively.

Then, a molded underfill (MUF) process may be performed to mold a molding member on the insulation layer 60, to form the mold substrate 700 covering the first semiconductor chip 240, the support member 500 and the second semiconductor chips 600. For example, the mold substrate 700 may include an epoxy molding compound.

Figure 33:
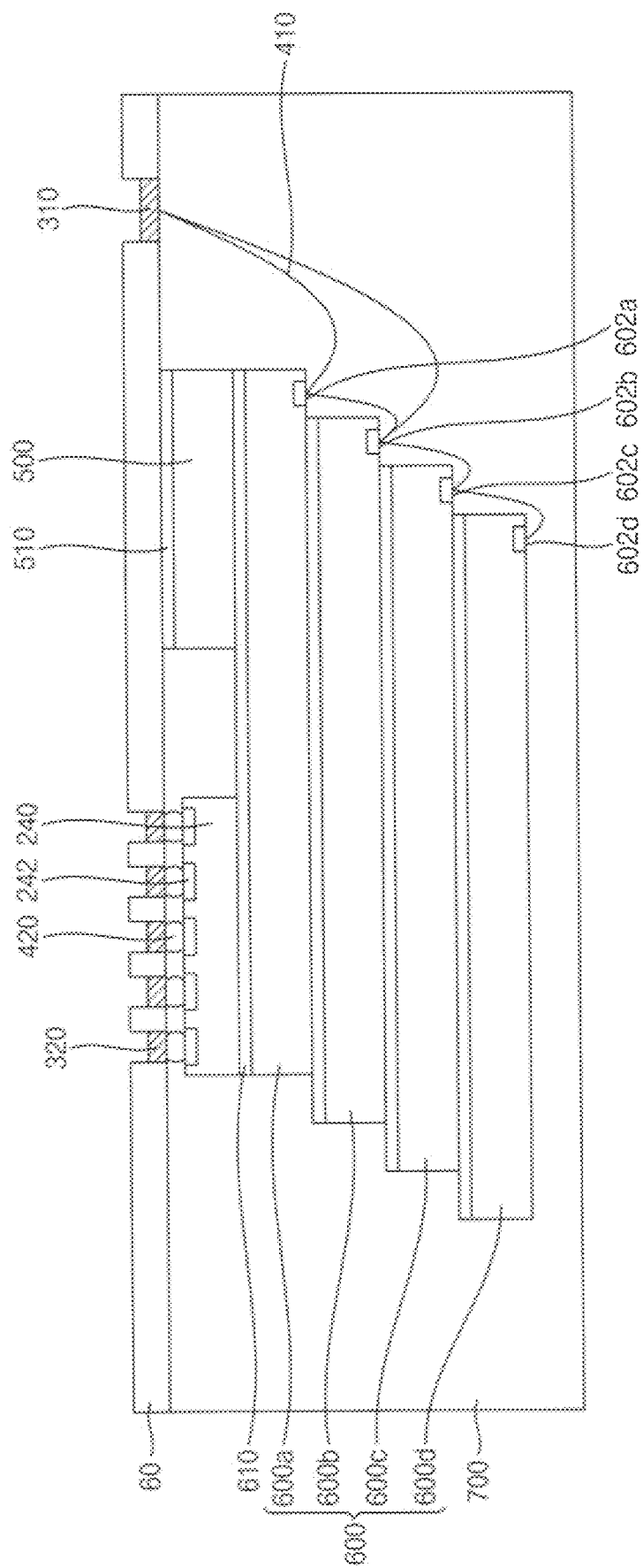
Figure 34:
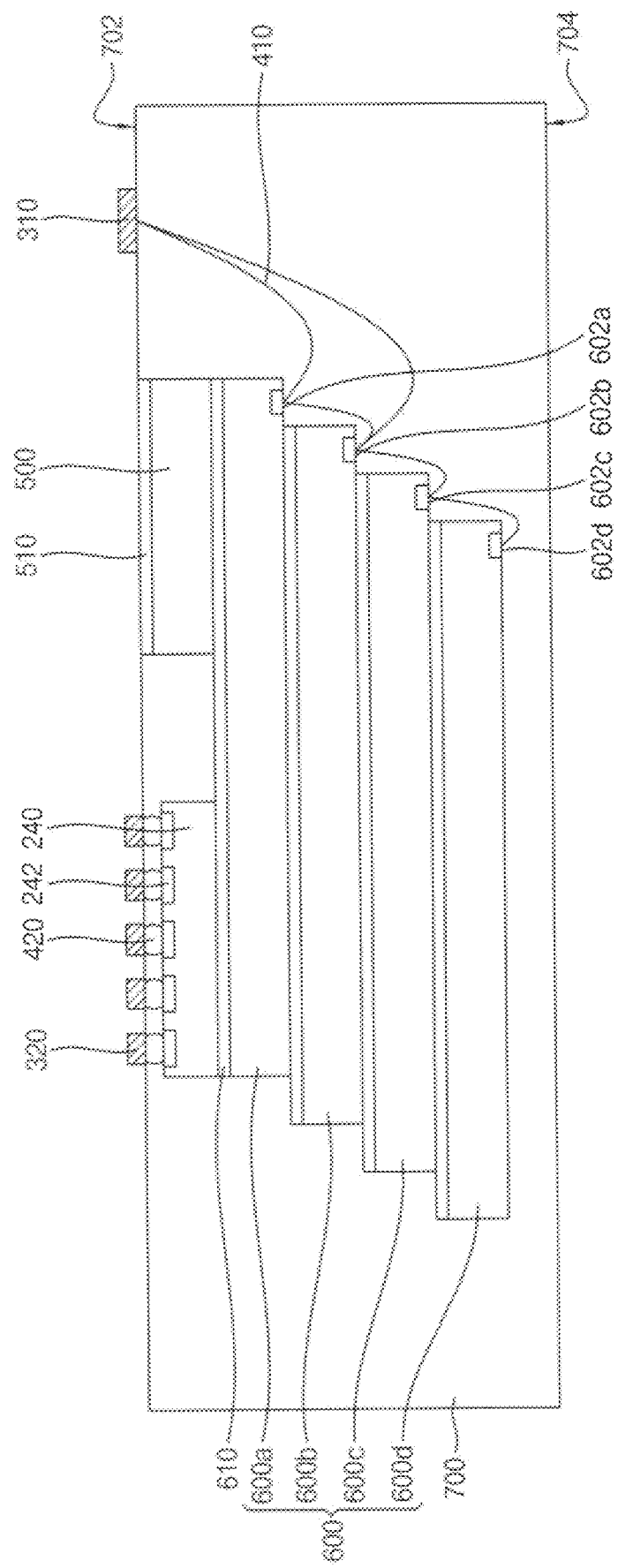

Referring to FIGS. 33 and 34, the structure including the mold substrate 700 formed therein in FIG. 32 may be reversed, and then, the dummy substrate 10, the metal layer 50 and the insulation layer 60 may be removed from the mold substrate 700.

For example, after the dummy substrate 10 is removed, a selective etch process may be performed to remove the metal layer 50 and the insulation layer 60.

Thus, the relay bonding pads 310 and the bump bonding pads 320 may be exposed from the first surface 702 of the mold substrate 700.

Figure 35:
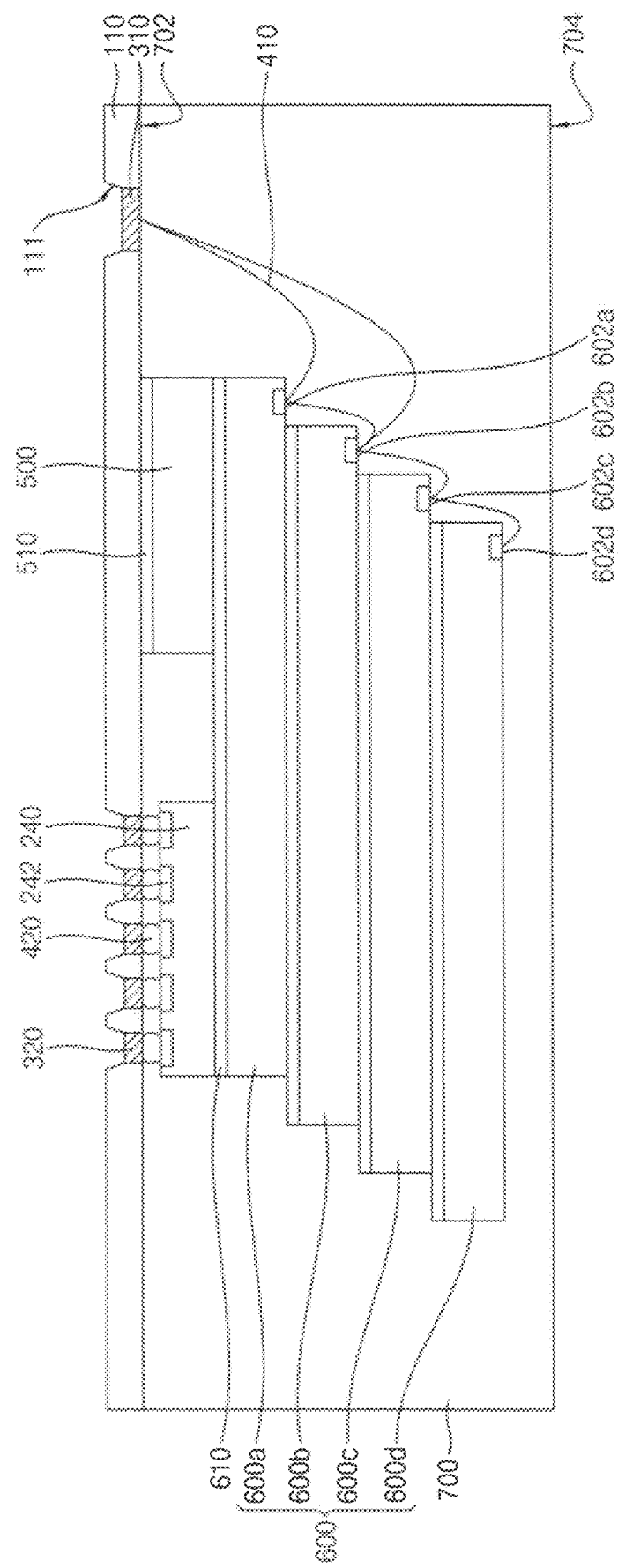

Referring to FIG. 35, a first insulation layer 110 having first openings 111, which expose the wiring bonding pads 310 and the bump bonding pads, respectively, may be formed on the first surface 702 of the mold substrate 700.

In some example embodiments, after the first insulation layer 111 is formed to cover the first surface 702 of the mold substrate 700, the wiring bonding pads 310 and the bump bonding pads 320, the first insulation layer may be patterned to form the first openings 111 to expose the wiring bonding pads 310 and the bump bonding pads 320, respectively.

For example, the first insulation layer 110 may include polymer, a dielectric material, etc. The first insulation layer 110 may be formed by a vapor deposition process, a spin coating process, etc.

Figure 36:
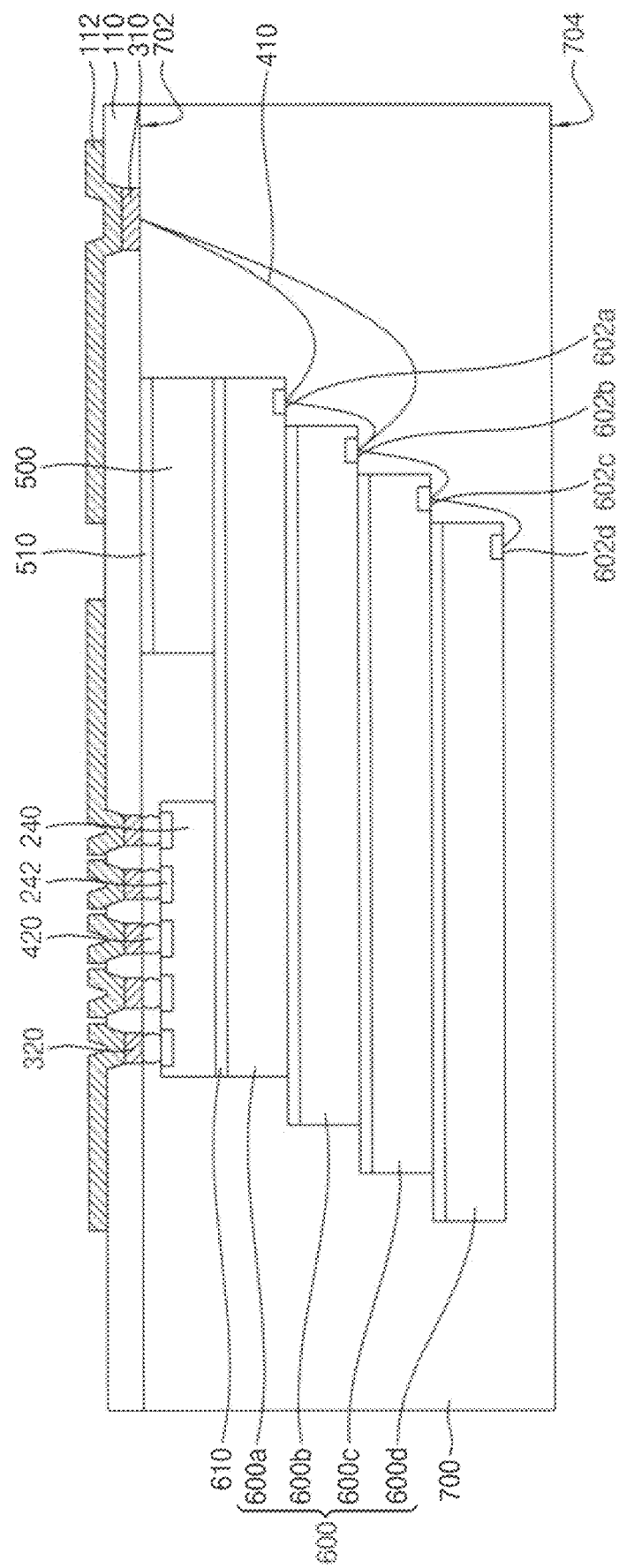

Referring to FIG. 36, first redistribution wirings 112 may be formed on the first insulation layer 110 to make contact with the wiring bonding pads 310 and the bump bonding pads 320 through the first openings 111, respectively.

In some example embodiments, the first redistribution wirings 112 may be formed on portions of the first insulation layer 110, the wiring bonding pads 310, and the bump bonding pads 320. The first redistribution wirings 112 may be formed by forming a seed layer on the portions of the first insulation layer 110 and on the first openings 111, patterning the seed layer, and performing an electroplating process.

Accordingly, at least portions of the first redistribution wirings 112 may make contact with the wiring bonding pads 310 or the bump bonding pads 320 through the first openings.

Figure 37:
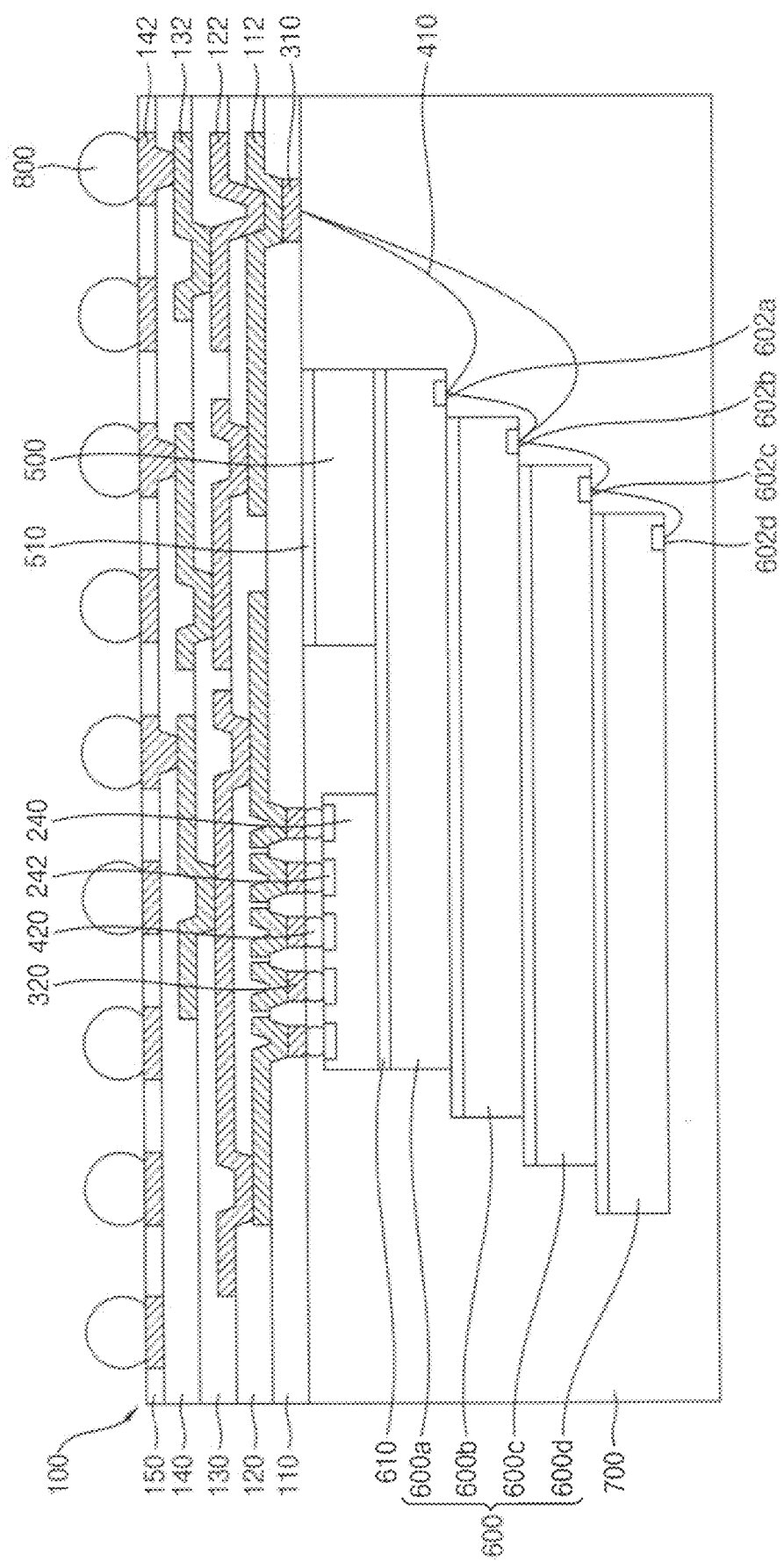

Referring to FIG. 37, processes the same as or substantially similar to the processes described with reference to FIGS. 35 and 36 may be performed to form a redistribution wiring layer 100 on the first surface 702 of the mold substrate 700, and then, outer connection members 800 may be formed on the redistribution wiring layer 100.

In some example embodiments, the redistribution wiring layer 100, which includes redistribution wirings electrically connected to the wiring bonding pads 310 or the bump bonding pads 320, may be formed on the first surface 702 of the mold substrate 700. Thus, the redistribution wiring layer 100 may be formed to include fan out type solder ball landing pads, which are formed on the mold substrate 700, and correspond to each die of a wafer by performing semiconductor manufacturing processes.

Then, the outer connection members 800 may be formed on the redistribution wiring layer 100 to be electrically connected to the redistribution wirings.

Then, a sawing process may be performed to divide the mold substrate 700 individually to complete a fan out wafer level package including the mold substrate 700 having the relay bonding pads 310 and 320, and the redistribution wiring layer 100 on the mold substrate 700.

The aforementioned methods of manufacturing the semiconductor package may be applied to manufacture semiconductor packages including logic devices and memory devices. For example, the semiconductor package may include logic devices (e.g., central processing units (CPUs), main processing units (MPUs), or application processors (APs)), and volatile memory devices (e.g., DRAM devices or SRAM devices), or non-volatile memory devices (e.g., flash memory devices, PRAM devices, MRAM devices, or ReRAM devices).

The foregoing example embodiments are illustrative and are not to intended to be construed as limiting thereof. Although a few example embodiments have been described, those skilled in the art will readily appreciate that many modifications are possible in example embodiments without materially departing from the novel teachings and advantages of the present inventive concepts. Accordingly, all such modifications are intended to be included within the scope of example embodiments as defined in the claims.

What is claimed is:

1. A method of manufacturing a semiconductor package, comprising:
    forming first and second wiring bonding pads on a dummy substrate;
    stacking a first semiconductor chip on the dummy substrate;
    stacking a support member on the dummy substrate such that the support member is arranged to be spaced apart from the first semiconductor chip;
    forming first bonding wires to connect first chip pads of the first semiconductor chip with the first wiring bonding pads;
    stacking a plurality of second semiconductor chips on the first semiconductor chip and the support member;
    forming second bonding wires to connect second chip pads of the second semiconductor chips with the second wiring bonding pads;
    covering the first semiconductor chip, the support member and the second semiconductor chips on the dummy substrate with a molding member to form a mold substrate;
    removing the dummy substrate from the mold substrate such that the first and second wiring bonding pads are exposed from a first surface of the mold substrate; and
    forming a redistribution wiring layer on the first surface of the mold substrate, the redistribution wiring layer including redistribution wirings electrically connected to the first and second wiring bonding pads.

2. The method of claim 1, wherein the forming a redistribution wiring layer comprises:
    forming a first insulation layer on the first surface of the mold substrate, the first insulation layer having openings exposing the first and second wiring bonding pads; and
    forming first redistribution wirings, from among the redistribution wirings, on the first insulation layer, the first redistribution wirings making contact with the first and second wiring bonding pads through the openings.

3. The method of claim 1, further comprising:
    forming a separating layer on the dummy substrate, before the forming the first and second wiring bonding pads.

4. The method of claim 3, further comprising:
    removing the separating layer from the mold substrate, after or when the removing the dummy substrate.

5. The method of claim 1, wherein the stacking a first semiconductor chip on the dummy substrate comprises arranging the first semiconductor chip such that the first chip pads are on a first surface of the first semiconductor chip, and a second surface of the first semiconductor chip that is opposite to the first surface of the first semiconductor chip faces the dummy substrate.

6. The method of claim 5, wherein the removing the dummy substrate from the mold substrate comprises exposing the second surface of the first semiconductor chip by the first surface of the mold substrate.

7. The method of claim 1, wherein the stacking a second semiconductor chips comprises arranging the second semiconductor chips such that the second chip pads are on a third surface of each of the second semiconductor chips, and a fourth surface of each of the second semiconductor chip that is opposite to the third surface of the second semiconductor chip faces the dummy substrate.

8. The method of claim 1, wherein the stacking a plurality of second semiconductor chips comprises sequentially stacking a plurality of the second semiconductor chips by adhesive layers.

9. The method of claim 1, wherein the stacking a plurality of second semiconductor chips comprises stacking the second semiconductor chips in a cascade structure.

10. The method of claim 1, wherein the stacking a support member comprises stacking the support member on the dummy substrate such that the support member has a height from the dummy substrate same as that of the first semiconductor chip.

11. A method of manufacturing a semiconductor package, comprising:
    forming first and second relay bonding pads on a dummy substrate;
    stacking a first semiconductor chip on the dummy substrate such that first chip pads are on a first surface of the first semiconductor chip, and a second surface of the first semiconductor chip that is opposite to the first surface of the first semiconductor chip faces the dummy substrate;
    forming first bonding wires to connect the first chip pads of the first semiconductor chip with the first relay bonding pads;
    stacking a plurality of second semiconductor chips on the first semiconductor chip;

forming second bonding wires to connect second chip pads of the second semiconductor chips with the second relay bonding pads;

covering the first semiconductor chip and the second semiconductor chips on the dummy substrate with a molding member to form a mold substrate;

removing the dummy substrate from the mold substrate such that the first and second relay bonding pads are exposed from a first surface of the mold substrate; and forming a redistribution wiring layer on the first surface of the mold substrate, the redistribution wiring layer including redistribution wirings electrically connected to the first and second relay bonding pads.

12. The method of claim 11, wherein the forming a redistribution wiring layer comprises:

forming a first insulation layer on the first surface of the mold substrate, the first insulation layer having openings exposing the first and second relay bonding pads; and forming first redistribution wirings on the first insulation layer, the first redistribution wirings making contact with the first and second relay bonding pads through the openings.

13. The method of claim 11, further comprising:

stacking a support member on the dummy substrate such that the support member is arranged to be spaced apart from the first semiconductor chip.

14. The method of claim 13, wherein the stacking a support member comprises stacking the support member on the dummy substrate such that the support member has a height from the dummy substrate the same as that of the first semiconductor chip.

15. The method of claim 11, wherein the stacking a plurality of second semiconductor chips comprises arranging the second semiconductor chips such that the second chip pads are on a third surface of each of the first semiconductor chips, and a fourth surface of each of the second semiconductor chip that is opposite to the third surface of the second semiconductor chip faces the dummy substrate.

16. The method of claim 11, wherein the stacking a plurality of second semiconductor chips comprises sequentially stacking a plurality of the second semiconductor chips by adhesive layers.

17. The method of claim 11, further comprising:

forming a separating layer on the dummy substrate, before the forming first and second relay bonding pads.

18. The method of claim 17, further comprising:

removing the separating layer from the mold substrate, after or when the removing the dummy substrate.

19. The method of claim 11, wherein the removing the dummy substrate from the mold substrate comprises exposing the second surface of the first semiconductor chip by the first surface of the mold substrate.

20. The method of claim 11, further comprising:

disposing outer connection members on an outer surface of the redistribution wiring layer.

* * * * *